United States Patent [19]

Judd et al.

[11] Patent Number: 5,247,650
[45] Date of Patent: Sep. 21, 1993

[54] SYSTEM FOR COMBINING ORIGINALLY SOFTWARE INCOMPATIBLE CONTROL, KINEMATIC, AND DISCRETE EVENT SIMULATION SYSTEMS INTO A SINGLE INTEGRATED SIMULATION SYSTEM

[75] Inventors: Robert P. Judd, Rochester Hills; John F. White, Ypsilanti; Peter K. Hickman, Ann Arbor; Mark E. Brown, Brighton; John A. Sauter, Ann Arbor, all of Mich.

[73] Assignee: Industrial Technology Institute, Ann Arbor, Mich.

[21] Appl. No.: 400,069

[22] Filed: Aug. 30, 1989

[51] Int. Cl.5 ............... G06F 15/60; G06F 9/455
[52] U.S. Cl. ..................... 395/500; 364/221; 364/221.9; 364/222; 364/271.9; 364/DIG. 1
[58] Field of Search ... 364/200 MS File, 900 MS File, 364/578; 395/500

[56] References Cited

U.S. PATENT DOCUMENTS

| | | | |
|---|---|---|---|
| 4,253,145 | 2/1981 | Goldberg | 364/200 |
| 4,604,718 | 8/1986 | Norman et al. | 364/578 |
| 4,656,580 | 4/1987 | Hitchcock, Sr. et al. | 364/200 |
| 4,714,995 | 12/1987 | Materna et al. | 364/200 |
| 4,733,347 | 3/1988 | Rukuoka | 364/200 |
| 4,751,637 | 6/1988 | Catlin | 364/200 |
| 4,796,194 | 1/1989 | Atherton | 364/468 |
| 4,816,989 | 3/1989 | Finn et al. | 364/200 |
| 4,829,451 | 5/1989 | Thomas et al. | 364/513 |
| 4,873,656 | 10/1989 | Catlin | 364/578 |
| 4,916,647 | 4/1990 | Catlin | 364/578 |
| 4,935,886 | 6/1990 | Choka | 364/578 |
| 4,965,743 | 10/1990 | Malin et al. | 364/578 |
| 5,081,601 | 1/1992 | Eirikasson | 364/578 |
| 5,111,413 | 5/1992 | Lazansky et al. | 364/578 |

*Primary Examiner*—Thomas C. Lee
*Assistant Examiner*—William M. Treat
*Attorney, Agent, or Firm*—Harness, Dickey & Pierce

[57] ABSTRACT

A method and apparatus are disclosed which allows a plurality of dissimilar simulation systems to act in a cooperative manner such that they may act to provide a single overall simulation of a system. The system to be simulated is partitioned into these simulation systems and subsequently these systems are networked and synchronized. This interaction of these dissimilar simulation systems is accomplished by a simulation tool which allows a simulation system to route messages to other systems, synchronizes the operation of all simulation systems, allows partitioning elements to be stored and downloaded to these systems, and allows each simulation system to utilize its own native programming language during the creation of the single system simulation associated therewith.

8 Claims, 16 Drawing Sheets

FIGURE 14

↳ FRS ARRIVED ( MESSAGE TAG ) ( CURRENT METHOD ID )
   440      442           444                446

FIGURE 15

↳ GET FRS PARAMETER ( MESSAGE TAG ) ( CURRENT METHOD ID ) ( i )
  450   452              454              456              458

FIGURE 16

↳ SEND CMD ( ID DESTINATION ELEMENT ) ( ID OF COMMAND TO BE PERFORMED ) ( NUMBER OF PARAMETERS TO BE SENT ) ( PARAMETER ARRAY )
  460 462         464                        466                              468                              470

FIGURE 17

↳ CMD ARRIVED ( CMD CODE )
  472            474        476

FIGURE 31

596 598 600 602
→ GET CMD PARAMETER ( CMD CODE ) ( PARAMETER INDEX )

FIGURE 32

604 606 608
→ GET CRQ PARAMETER ( PARAMETER INDEX )

FIGURE 33

610 612 614
→ CODE ( CURR METHOD )

SYSTEM FOR COMBINING ORIGINALLY SOFTWARE INCOMPATIBLE CONTROL, KINEMATIC, AND DISCRETE EVENT SIMULATION SYSTEMS INTO A SINGLE INTEGRATED SIMULATION SYSTEM

BACKGROUND OF THE INVENTION

1. Field of the Invention

This invention relates to a method and apparatus for the computerized simulation of automated factory systems, and more particularly, to a method and apparatus which allows a plurality of dissimilar computerized simulation systems or other elements of a factory system to be interactively coordinated, so that a single overall simulation of an entire factory system may be accomplished.

2. Discussion

Computerized simulation systems are used in a wide variety of factory and other applications where it is desirable to design and test an actual factory system without physically constructing it. These simulation systems allow the actual simulated system to be modified electronically so as to view changes in simulated system characteristics and performance functions as different features and entities are incorporated therein. These computerized simulation systems allow a system designer to view these changes without the needed expense and time associated with the actual purchasing or building of the system to be simulated or of the different sub-system entities or other components which are desired to be placed within the actual system. These computerized simulation systems typically reduce overall system design costs and decrease total design time.

Several different software-based systems for simulating factory equipment are now commercially available, and some of them are discussed below. While these simulation systems have proved to be a great design tool, they still have a number of drawbacks or shortcomings associated therewith. For example, each of these prior simulation systems have usually been created to perform a specific type of simulation task, often to the exclusion of other types of needed system tasks. For example, a kinematic simulation system generally allows a designer to perform such simulation tasks as determining the cycle time for a robot path, comparing the performance of different system robots, and developing robotic programs and modeling tools used upon the robots. Many of these kinematic simulation systems, however, are insufficient in other respects. For example, they usually fail to adequately model the flow of material within the simulated system due to the amount of detail that must be specified therewith, and they usually fail to provide procedures to develop statistical analysis of simulated system parameters or develop probabilistic system information. Also, they typically employ a lower level programming language than is typically used within a control portion of the modeled or simulated system, which makes it difficult to exchange simulation data between the kinematic simulation and other simulation systems which may also be in use.

A discrete event simulation system generally performs such tasks as predicting the performance of an actual system that is being simulated based upon certain defined inputs, capturing the currently available data for the simulated system so that it may be used as a baseline model, examining the effects of work station failures on actual simulated system throughput, and examining the effect of changes in the actual system parameters such as number of parts and queue sizes in terms of expected simulated system cycle time. Weaknesses of such prior discrete event simulation systems include the difficulty associated with the documentation of control techniques and the transition of these techniques to the actual system controllers. Additionally these simulation systems are usually unable to include three dimensional modeling techniques for physical devices which are placed within the actual system to be simulated.

Control simulation systems generally allow a system designer to make incremental modifications or expansions of the actual system control design, to determine needed interactions between a system work station within the actual system to be simulated, to determine parameters needed to coordinate elements within a work station, to generate test sequences, and to allow migration toward real system control. Weakness of such control simulation systems include the usual exclusion of three dimensional kinematic information associated with the actual system devices, the exclusion of statistical analysis procedures related to actual simulated system parameters, the difficulty associated with modeling time in the control domain, and the usual inability to model actual systems from a discrete-event point of view.

The combined use of any two or more of these different independent simulation systems mentioned above to simulate the operational characteristics of a factory system has proven to be very cumbersome and inefficient because changes made by one of the simulation systems are not automatically reflected within the simulations accomplished by the other simulation system in the combination. This, of course, creates errors and system design delays in realizing or perfecting the overall system simulation. This independence between the various simulation systems in use is thus counterproductive and fails to reflect, in the overall system simulation, the true interdependence of the various simulation systems upon the overall simulation to be created relative to the actual factory system or other system type to be simulated.

Additionally, current partitioning methodologies, although providing techniques for accurately "fitting" pieces of the simulated system into one of the aforementioned plurality of dissimilar simulation systems, fail to adequately allow such a system to be partitioned such that such fitting or mapping is easily and forthrightly accomplished and more importantly, usually fail to allow a system designer the opportunity to save and reuse prior simulation developments thusly saving time and resources in the development of the additional simulations. Thusly, these current methodologies introduce additional error into the simulation process by failing to adequately allow a system designer to easily decide which part of the factory system to be simulated should be placed into a particular simulation system or even which parts are necessary in order to achieve a viable and representative simulation. This lack of easily mapping simulated system pieces to a simulation system coupled with a lack of interaction between individual simulation systems has caused many errors in the simulation process and caused much time delay. Further, this inability to reuse prior developed simulation code has resulted in a concomitant waste of time and resources associated with the development of the desired simulation.

In light of the foregoing problems, it is therefore a principal object of the present invention to provide a simulation tool and methodology which allows a plurality of dissimilar simulation systems to be interactively networked so as to cooperate in the creation of a single overall simulation system of a factory system.

It is another object of this invention to define a plurality of devices within each of said dissimilar simulation systems and to provide a local communications portion and a local synchronization portion, within each of the devices, to route messages to and from the device and to synchronize the operation of the device respectively.

It is another object of this invention to provide a simulation system synchronization and communication router, resident in each of the dissimilar simulation systems, to route messages to and from each of the devices contained within the simulation system and to synchronize the operation of substantially all of the devices therein.

It is yet another object of this invention to provide a centralized control unit having a centralized synchronization portion therein, electronically coupled to each of the aforementioned simulation system synchronization and communication routers for generally synchronizing the operation of each of the dissimilar simulation systems.

It is yet a further object of this invention to provide an interface for each simulation system, with the interface being connected to the local synchronization portion of substantially all of the devices contained therein and which allows each of the individual simulation systems to utilize its own native programming language in achieving and creating an overall simulation of the factory system.

It is another object of this invention to provide a communications network to electronically couple the centralized control unit to each of the devices within each of the individual simulation systems with this network electronically transporting the messages therebetween.

It is yet another object of this invention to provide a partitioning methodology to allow a system designer to easily partition the overall actual system to be simulated into a number of individual dissimilar simulation systems by defining a plurality of components associated with the overall system and placing each component into one of the individual simulation systems and to further enable the storage and reuse of created simulation coding.

It is a further object of this invention to provide a centralized library which is in communication with the centralized control unit for allowing the developed simulation components and associated developed simulation code to be stored and retrieved therefrom thusly allowing simulation resources to be deployed in a substantially more efficient manner.

SUMMARY OF THE PRESENT INVENTION

According to the teachings of the present invention, a simulation system and methodology may be developed which allows for the use of multiple independent simulation systems such that these systems are in interactive communication and cooperate to provide a single simulation of an entire system, such as an automated factory system. A partitioning methodology may also be employed to easily partition the system to be simulated into a plurality of dissimilar simulation systems and to allow created simulations to be stored and retrieved for later use. The simulation tool of the preferred embodiment of the invention employs a centralized control unit having a centralized synchronization manager which synchronizes the operation of each of the systems and a library portion. The library portion is in communication with each of the individual simulation systems and allows completed simulation code to be stored and retrieved for later use therefrom.

The simulation tool, made in accordance with the preferred embodiment of this invention, further defines each of the simulation systems as having one or more devices resident therein. Each of the devices has an interface portion which is electronically coupled to the simulation system that it is contained within and which allows the simulation tool to be utilized by the creation of simulation code defined by the individual native programming languages of each of the simulation systems.

Each of the devices contains a local synchronization and communications portion which synchronizes the operation of the device and routes messages to and from the device respectively. Each of the simulation systems, in one embodiment, may further contain a synchronization and communications router which is electronically coupled to each of the contained devices and to the centralized control unit and which itself synchronizes the contained devices thusly greatly increasing the efficiency of the synchronization process while allowing the contained devices to receive and transmit messages to devices residing in other simulation systems.

Further, the simulation systems and the centralized control unit are each electronically coupled to a communications network such as twisted wire or co-axial cable wherein the network electronically conducts messages thereon. The preferred access protocol of this invention is that of the RS232C standard but any other type of access protocols may be used such as that of the IEEE 802.3, 802.4, 802.5 or Ethernet standards.

The partitioning methodology of this invention views each physical entity of the system to be simulated as either a control or a physical element. Each control element in one embodiment has a single physical element in association and communication therewith, and each such pair of control and physical elements defines a simulated system component. Messages, in the preferred embodiment of this invention, may be generated from any of the elements and may flow within or between individual components. The centralized control unit of this invention further contains a library portion which allows defined components to be stored and retrieved for later use along with the developed simulation code associated therewith.

In the preferred embodiment of this invention, these dissimilar simulation systems are interactively networked, each containing a plurality of defined elements which are arranged as devices. These simulation systems, in the preferred embodiment of this invention, are of the kinematic, discrete event, and control simulation type. All of the defined control elements are preferably placed within the control simulation system, while the defined physical elements preferably are distributed among the discrete event and kinematic simulation systems. The interactive networking of this plurality of dissimilar simulation systems allows a single comprehensive system simulation to be realized.

These and other aspects, features, advantages, and objects of this invention will be more readily understood by reviewing carefully the following detailed description in conjunction with the accompanying drawings and subjoined claims.

BRIEF DESCRIPTION OF THE DRAWINGS

For a more complete understanding of the present invention, relative to the advantages thereof, reference may be made to the following detailed description taken in conjunction with the accompanying drawings, in which:

FIGS. 13-21 are illustrations of various function calls associated with a typical Flexis simulation system which may be used in conjunction with the simulation tool this invention, wherein:

FIG. 13 is an illustration of a "Send CRQ" function call;

FIG. 14 is an illustration of a "FRS Arrived" function call;

FIG. 15 is an illustration of a "Get FRS Parameter" function call;

FIG. 16 is an illustration of a "Send CMD" function call;

FIG. 17 is an illustration of a "CMD Arrived" function call;

FIG. 18 is an illustration of a "Get CMD Source" function call;

FIG. 19 is an illustration of a "Get CMD Parameter" function call;

FIG. 20 is an illustration of a "Reset CMD" function call;

FIG. 21 is an illustration of a "FRS Reply" function call;

FIGS. 24-33 are illustrations of various function calls associated with a typical Robcad simulation system which may be used in conjunction with the simulation tool of the present invention, wherein:

FIG. 24 is an illustration of a "FRS Reply" function call;

FIG. 25 is an illustration of a "Send CRQ" function call;

FIG. 26 is an illustration of a "FRS Arrived" function call;

FIG. 27 is an illustration of a "Send CMD" function call;

FIG. 28 is an illustration of a "CMD Arrived" function call;

FIG. 29 is an illustration of a "Reset CMD" function call;

FIG. 30 is an illustration of a "Get FRS" Parameter function call;

FIG. 31 is an illustration of a "Get CMD" Parameter function call;

FIG. 32 is an illustration of a "Get CRQ" Parameter function call; and

FIG. 33 is an illustration of a "Get Method Code" function call.

DETAILED DESCRIPTION OF THE PREFERRED EMBODIMENTS

This description is segmented into the following sectional explanations:

(I) Partitioning Methodology (Generally)
(II). Partitioning Methodology (Example)
(III). Simulation Tool Description
(a) Architectural Overview
(b) Messaging
(c) Devices
(d) Synchronization
(IV). Simulation System Interface
(a) Savoir System
(b) Siman System
(c) Robcad System
(V). Simulation System Epilogue I Partioning Methodology (Generally)

Figure 1:
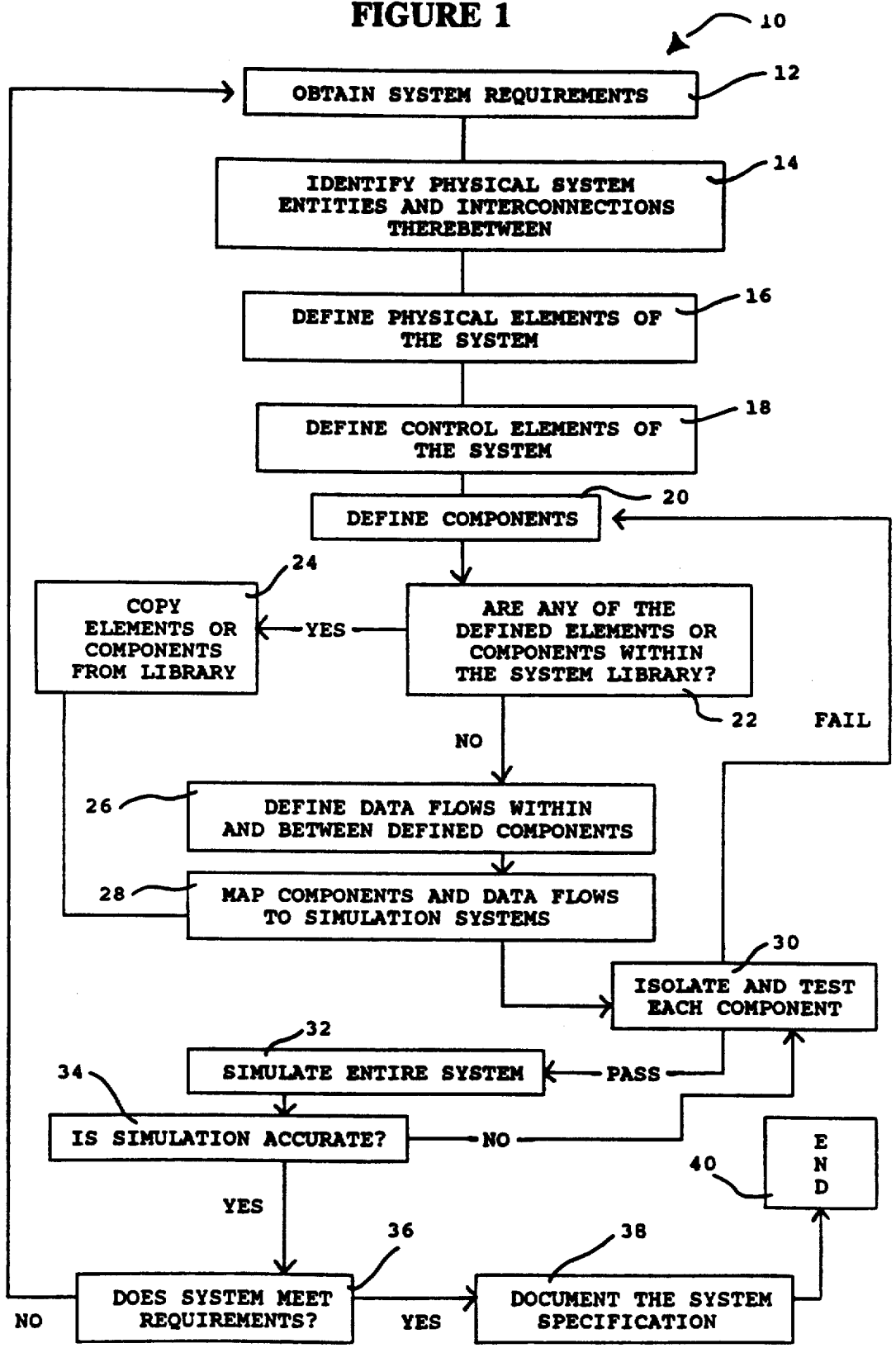
FIG. 1 is a flowchart describing the steps associated with the system partitioning methodology of the present invention.

Turning now to FIG. 1 there is shown a flowchart 10 containing steps 12-40 which illustrate a simulation system partitioning methodology of the present invention. Initially, as shown in step 12, a system designer must obtain requirements of the actual system (i.e., a factory automation system) to be simulated in the usual manner. Next, as illustrated in step 14, the system designer must identify physical system entities and all interconnections therebetween. Step 14 requires that all of the "parts" or "pieces," such as transfer lines, controllers, sensors, actuators and the like, comprising the system to be simulated, be identified. Each identified piece must serve some purpose within the simulated system and should be interconnected to at least one other piece. These physical system entities are defined by using standard design methodologies in view of the system requirements of step 12 and are defined to a typical needed level of granularity. Examples of associated interconnections of step 14 includes wiring, radio frequency connections, or lightwave interconnections as well as substantially all other types of typical mechanical interconnections or couplings of interest in the simulation. Additionally this methodology 10 also views material flow as an example of such an interconnection.

After the procedure associated with step 14 has been accomplished, step 16 requires the defining of "physical system elements". This term should be construed within partitioning methodology 10 as meaning the total aggregation of the kinematics and parameters necessary in order to describe the physical behavior of interest in each of the physical system entities previously identified in step 14 as well as the actual entity itself. Examples of such physical elements include a robot's arm and the allowable movement associated therewith or a sensor and the allowable output voltage therefrom.

After all of the physical elements of the simulated system have been defined, the next step 18 in methodology 10 involves the creation of system control elements, each of which is defined to be that aggregation of strategies and/or algorithms necessary to utilize one of the previously defined physical elements within the system to be simulated. Examples of such control elements include an algorithm for defining the movement of the previously defined robotic arm within the aforementioned simulated system, or an algorithm to be processed within the aforementioned sensor and which calculates and defines the necessary output voltage therefrom. Each physical element is then paired with a unique control element, thereby defining a simulated system component. A plurality of such components must be defined for the entire system to be simulated in order to meet the requirements of step 20. An example of such a component is the aggregation of the robot arm, its allowable movement, and the algorithm defining specific arm movement patterns. In another embodiment of this invention, some of the previously defined components may further be modelled as an aggregation of multiple control elements and associated physical entities in a decomposition arrangement thusly allowing for a greater level of detail to be specified relative to the actual system to be simulated.

The next step 22 requires the system designer to search within a system library to determine if any of the components defined in step 20 have been previously defined and stored. If so, step 24 requires that these elements or components be copied from the library for use. If not, step 26 requires the system designer to define all necessary data flows that must occur between (and within) the previously defined components of step 18 which aren't present within the system library of step 24 in order to have the actual simulated system accomplish its overall objectives. An overall objective may be, for example, the assembly of a finished product from a plurality of parts. An example of such a data flow includes the actual message flow between the robotic arm control element and the physical element representing the actual robot arm or the actual message representing actual material flow within the actual system.

Next, step 28 requires that each of the physical elements of step 16 and each of the control elements of step 18 and associated data flows be mapped into one of the individual simulation systems. This includes components obtained from the library associated with step 24. As will be further explained in FIG. 7, each of the individual simulation systems are electronically coupled to the simulation tool of the invention. Each previously defined element and its associated data flow is made to be simulated by one of the individual simulation systems in a conventional manner for that individual system. Each component is simulated, ideally, by the interaction of dissimilar simulation systems. In the preferred embodiment of the invention, all of the control elements are placed within a single control simulation system and all of the physical elements are placed within either a kinematic or a discrete event simulation system depending upon the nature of the element involved. For example, a sensor which outputs a voltage upon occurrence of an event is placed within the event simulation system, while the robot arm is placed within the kinematic simulation system.

The next step 30 of methodology 10 requires the isolation and testing of each of the defined components within the individual simulation system in which it resides. If the tests fail then the designer is directed back to step 20 to redefine the components. If the tests are passed the designer is directed to the next step 32 which requires that these dissimilar simulation systems be used to simulate the actual system. This is done in order to determine if the produced simulation is in fact a correct representation of the system to be simulated and if it does provide the needed results. If the simulation proves to produce a result which is inconsistent with known system or element attributes, or with the known operational system or element characteristics, then step 34 of methodology 10 requires the system designer to go back to step 30 and to thusly isolate and test each of the defined components again. If the created system simulation, in step 34, proves correct then the next step 36 requires the designer to determine if the simulated system meets the requirements of step 12. If the requirements are not met, step 36 requires the system designer to redefine and reobtain the system requirements of step 12. If the requirements are met of step 36, the designer then must document the system, as specified in step 38, in a typical manner. This documentation includes the operational characteristics of the associated defined elements contained therein. Actions in step 38 could include the storing of defined components and associated data flows within the library of step 24 for later use. After step 38 is completed, the next step 40 is entered into which defines the termination and completion of partitioning methodology 10.

Figure 2:
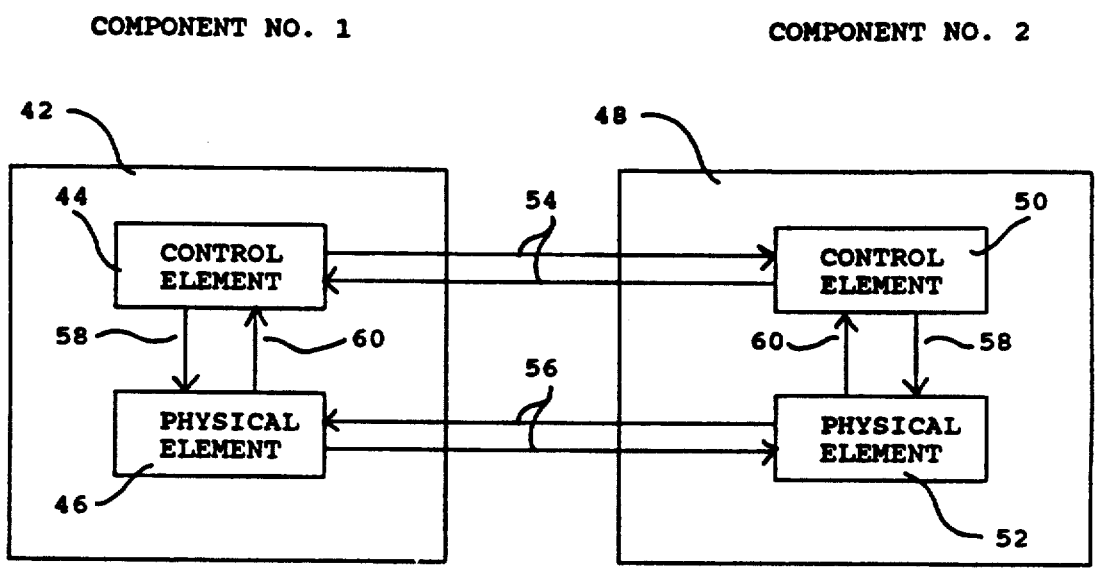
FIG. 2 is a diagram illustrating a component associated with the methodology of FIG. 1.

To further illustrate step 20 reference is now made to FIG. 2 where there is shown a first typical component 42 having control element 44 and physical element 46 therein, and a second typical component 48 having control element 50 and physical element 52 therein. The data flows associated with step 20 of methodology 10 are mapped into messages 54-60 as shown. Specifically, messages 54 may occur between control elements 44 and 50 and are defined to be an exchange of logical state change information. In the preferred embodiment of this invention, these logical state change messages are produced and received within a single simulation system and allow for the dynamic sharing of distributed control information associated with the overall system to be simulated. Thus, an entire simulated system may have the control associated therewith instructively networked by means of a plurality of control elements therein. Messages 56 may also occur only between physical elements 46 and 52 and are termed physical state changes. These messages 56 allow physical elements to pass material and physical state information therebetween. Messages 58 emanate from control elements 44 and 50 to their associated physical elements 46 and 52 respectively and are defined to be actuators, while messages 60 emanate from physical elements 46 and 52 to control elements 44 and 50 respectively and are defined to be sensors. Messages 58 and 60 allow control elements 44 and 50 to control their respective physical elements 46 and 52 and to obtain needed information from them. It should be noted that physical elements 46 and 52 may only communicate to other physical elements 52 and 46 or to their associated control elements 44 and 50 respectively.

It should be appreciated by one of ordinary skill in the art that the use of such previously defined components 42 and 48 within a simulation tool that is electronically coupled to a plurality of interactive dissimilar simulation systems, allows a system designer to easily partition an overall system to be simulated into one of the aforementioned dissimilar simulation systems, and thusly allows each such element 44-46 and 50-52 to be easily placed into one of the available individual simulation systems. Mapping is easily accomplished because the elements 44-46 and 50-52 are segregated in terms of easily observable functionality (i.e., control or physical characteristics). This easily observable functionality is then used to directly decide which one, out of the available plurality of individual simulation systems, these component elements 44-46 and 50-52 are to be placed. Additionally it should be appreciated by one of ordinary skill in the art that the library portion, of steps 24 and 38, allows for the reuse of previously defined components and thusly saves time and resources in later simulation developments.

II. Partitioning Methodology (Example)

Figure 3:
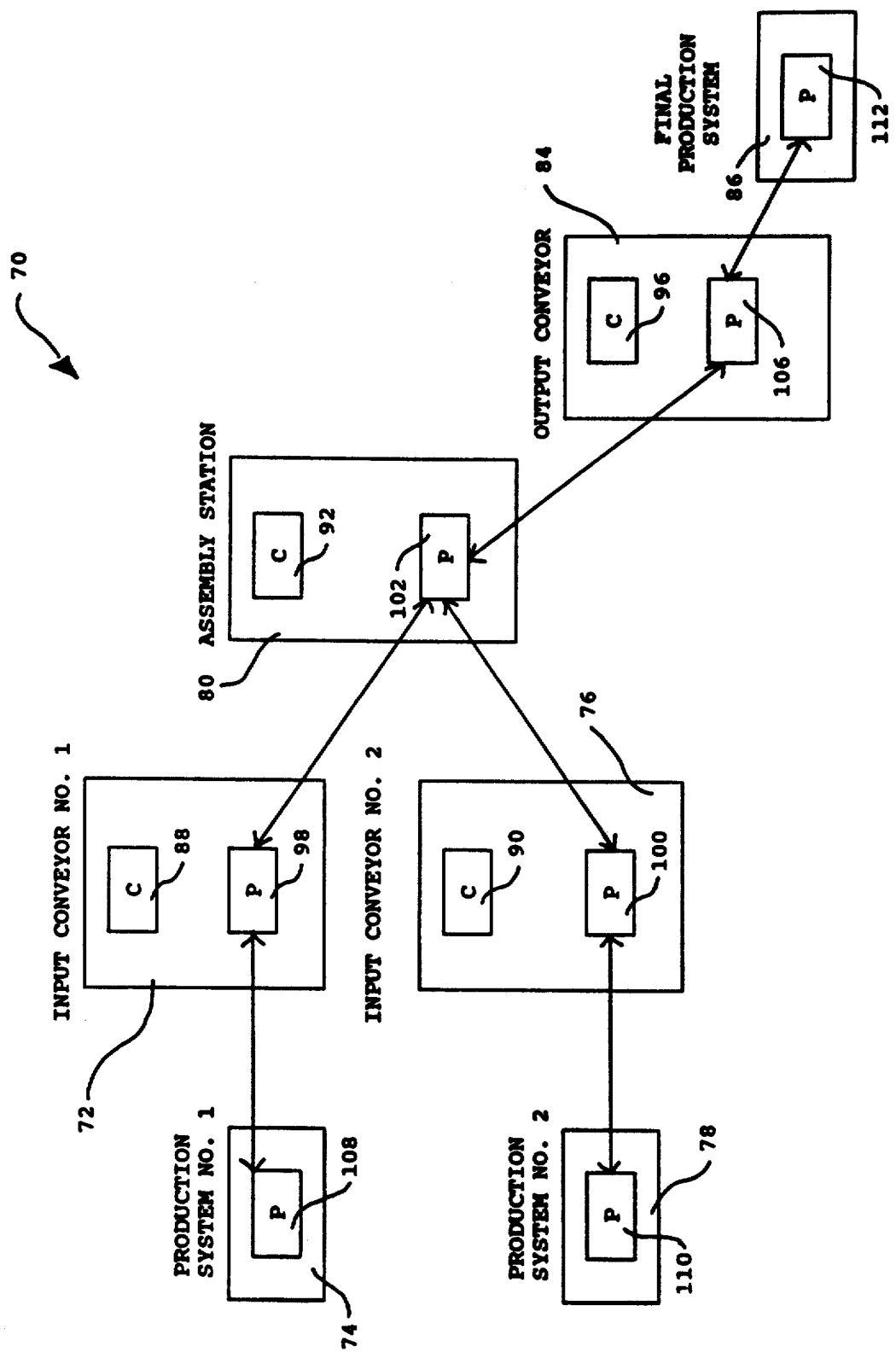
FIG. 3 is an illustration of the partitioning of a typical factory automation system according to the design methodology illustrated in FIG. 1.

To further illustrate the use of methodology 10, reference is now made to an automated assembly system 70, illustrated in FIG. 3 and which is representative of one class of factory automation systems which can be simulated using the simulation tool (to be later explained and partitioning methodology 10 of the preferred embodiment of this invention. A description of assembly system 70 will now ensue and its mapping onto methodology 10 will hereinlater be explained.

Prototypical factory automation assembly system 70 contains a first input conveyor 72 mechanically coupled to a first part production system 74, input conveyor 76 mechanically coupled to a second part production system 78, assembly station 80 (containing a typical mechanical press and loading robot), and output conveyor 84 mechanically coupled to assembly station 80 and to final part production system 86. Each of the entities 72, 76, 80 and 84 are modeled as containing control elements 88-96 and physical elements 98-106 respectively. Entities 74,78, and 86 are modeled as containing physical elements 108-112 respectively.

Figure 4:
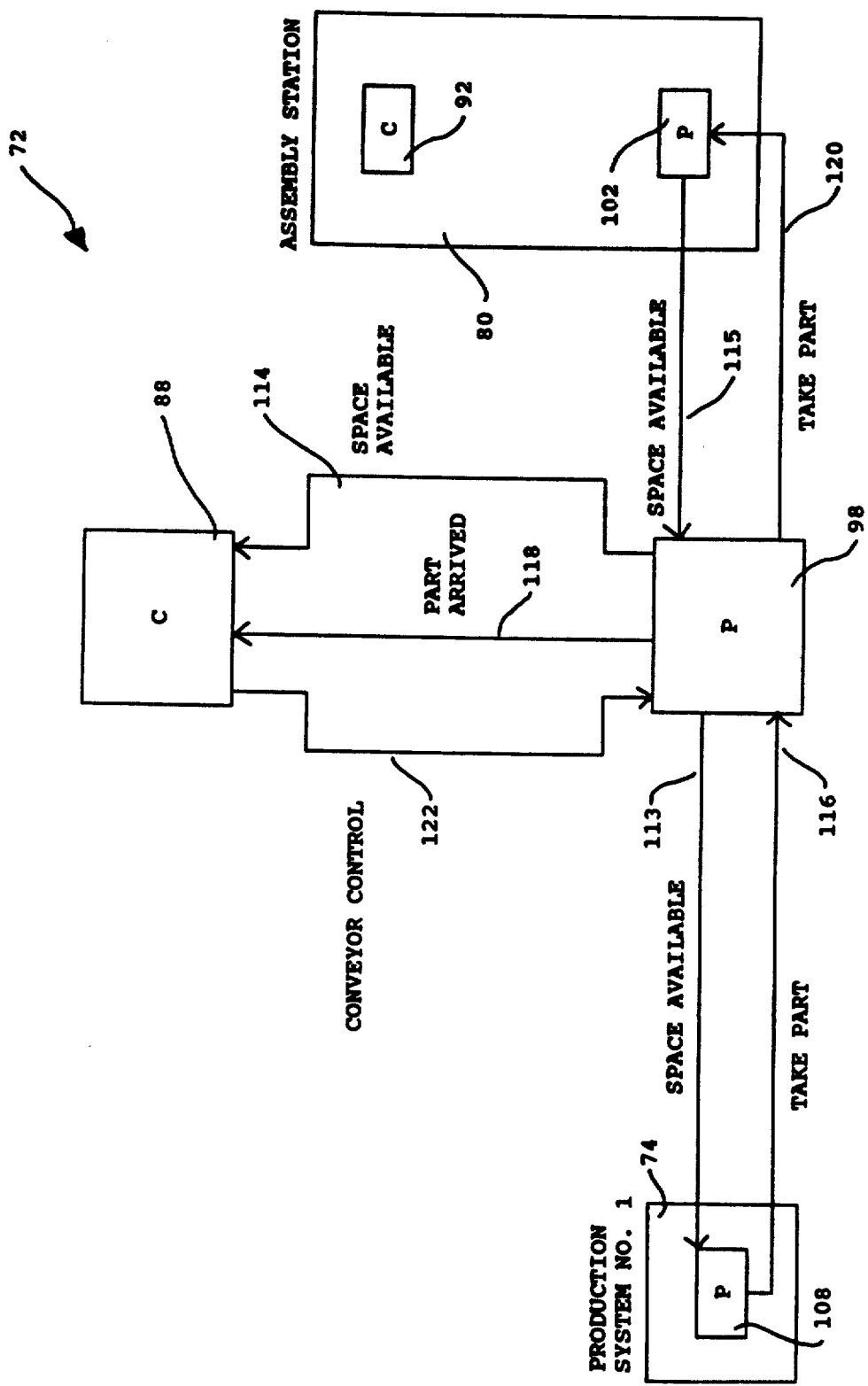
FIGS. 4-6 are illustrations of a data flow analysis of the system shown in FIG. 3, accomplished according to the requirements of the methodology illustrated in FIG. 1.

As shown best in FIG. 4, first input conveyor 72 generally delivers parts to assembly station 80 by means of its load robot. Entity 98 is therefore viewed as sending message 113 to element 108 within part production system 74 indicating thereto that there is space available on conveyor 72 for a part. Element 102 of assembly station 80 sends message 115 to element 98 informing conveyor 72 that there is space in assembly station 80 for a part. Element 98 sends message 114 informing its associated control element 88 that there is space available within assembly station 80 for a part. System 74 then issues a message 116 to element 98 to take a part therefrom. When the part arrives, at the end of the conveyor 72, element 98 issues message 118 to element 88 informing element 88 of the arrival of the moved part. The arrived part is subsequently transferred to assembly station 80 (i.e. picked up by the load robot of assembly station 80) and this action is represented by message 120 from element 98 to element 102. Element 88 also has the ability to turn conveyor 72 on or off (i.e., controlling the same) and such an activity is represented as message 122. Conveyor 76 interacts with assembly station 80 and system 78 by use of substantially similar messages 110-112 as herein explained and illustrated by the use of FIG. 4.

Figure 5:
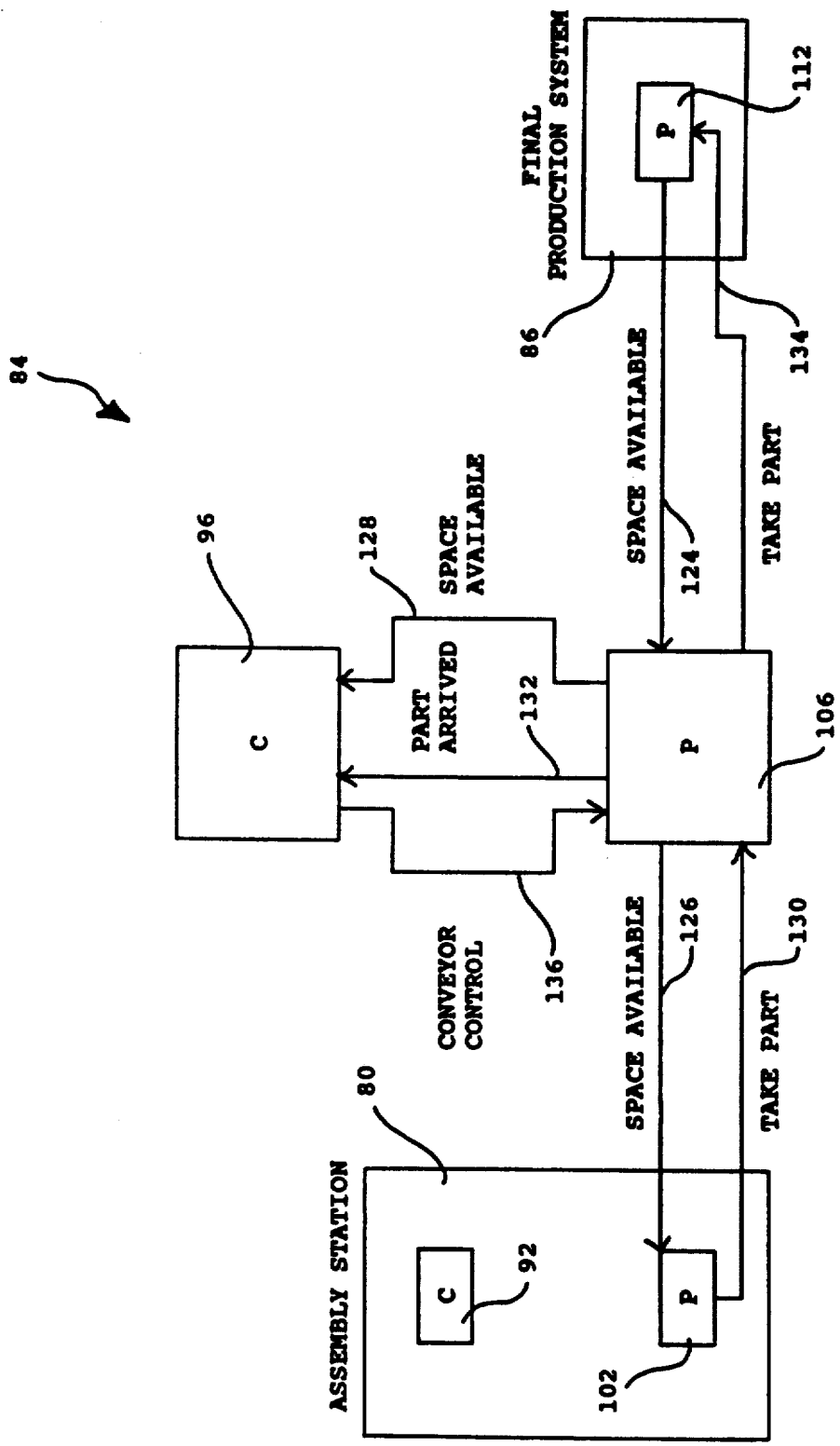

The simulated interaction of conveyor 84 with assembly station 80 and system 86 is illustrated in FIG. 5. Specifically, system 86 issues message 124 to element 106 indicating space for parts is available and element 106 generates message 128 to element 96 indicating available space in final production system 86. Element 106 sends message 126 to element 102 indicating space available on conveyor 84. Assembly station 80 then places a finished part upon conveyor 84 and this placement is represented by message 130 generated from element 102 to element 106. When the part arrives at the end of conveyor 84, element 106 generates message 132 to element 96 indicating the arrival of the part. The part is subsequently sent to system 86. This sending is represented by message 134 generated from element 106 to element 112. Element 96 also has control over the activation or deactivation of conveyor 84 and this is represented by the generation of message 136 from element 96 to element 106.

Figure 6:
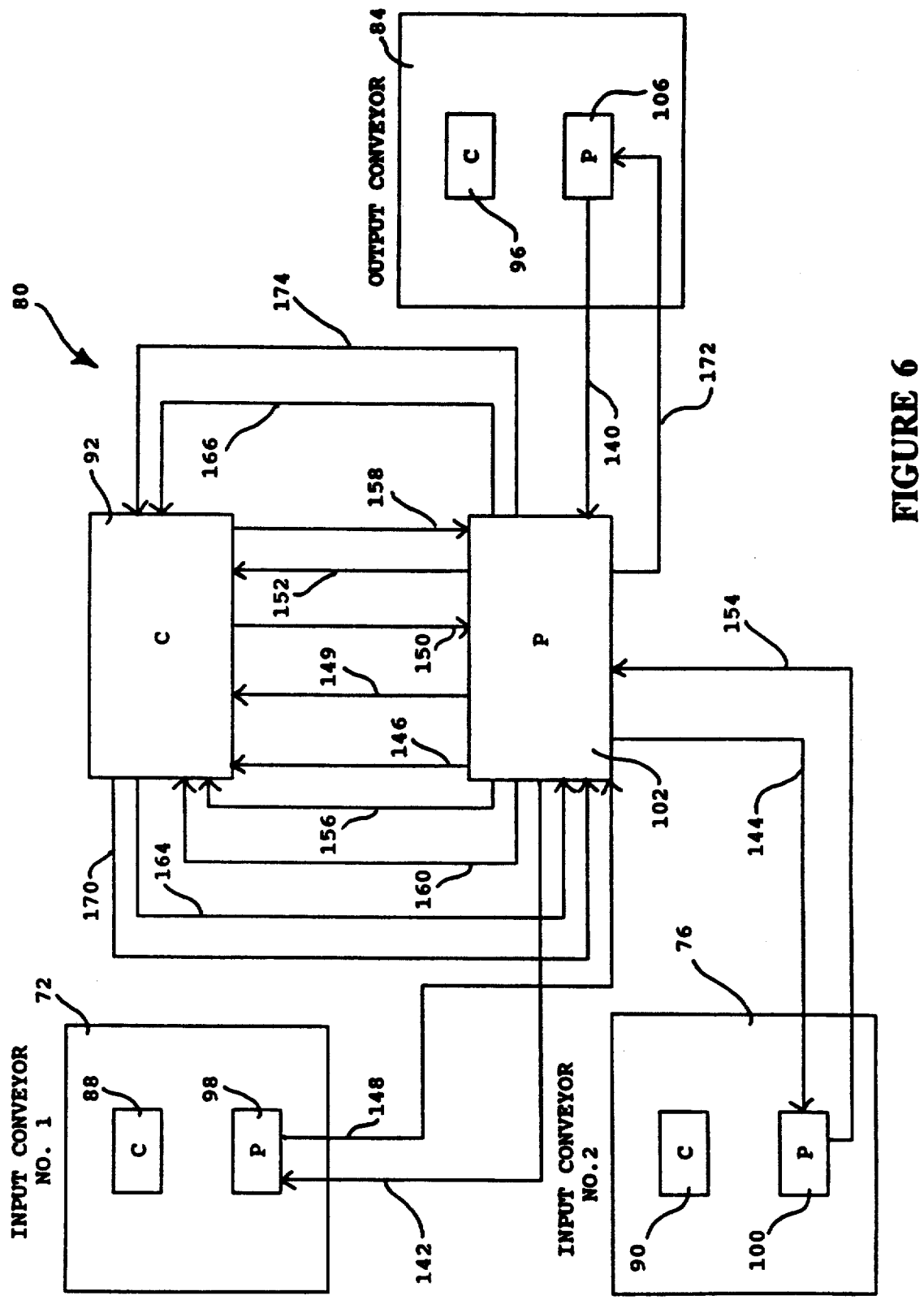

The simulated interaction of assembly station 80 with conveyors 72, 76, and 84 is shown in FIG. 6. Specifically, element 106 sends message 140 to element 102 indicating that there is space available upon conveyor 84 for a finished part. Element 102 is then made to send message 146 to element 92 and message 142 to element 98 indicating that space is available upon conveyor 84.

Element 98 then sends message 148 to element 102 indicating that a part is available. This availability is conveyed to element 92 by element 102 by means of message 149. Element 92 then orders element 102 to load the arrived part from conveyor 72 into the mechanical press associated with assembly station 80 by generating message 150 to element 102. When the part has been loaded into the press, message 152 is generated from element 102 to element 92 informing element 92 of the same.

Element 102 then informs element 100 of the available space for a part by message 144 and then element 100 then sends message 154 to element 102 informing element 102 of the presence of a part. This presence is made known to element 92 by the generation of message 156 from element 102 to element 92. Subsequently, element 92 orders element 102 to load the arrived part into the press, of assembly station 80, by the generation of message 158. When element 102 places this part into press 82, element 102 generates message 160 to element 92 informing element 92 of this occurrence.

When parts from both conveyors 72 and 76 are in the press, element 92 issues message 164 to element 102 ordering the mechanical press to act upon these contained parts. When the pressing has been accomplished, element 102 sends message 166 to element 92.

Upon receipt of message 166, element 92 issues message 170 to element 102 ordering element 102 to place the completed assembly (comprised of mechanically pressed parts from conveyors 72 and 76) onto conveyor 84. Element 102 then moves the completed assembly onto conveyor 84, represented by message 172 and informs element 92 of this movement by generating message 174 thereto.

The aforementioned simulated system clearly embellishes the requirements of methodology 10. Specifically, step 12 was initially accomplished by the requirement of pressing parts together with were obtained from production systems 74 and 78 and then subsequently placing the finished part on conveyor 84 and eventually into system 86. Step 14 was accomplished by the identification of systems 74, 78 and 86; conveyors 72, 76 and 84; assembly station 80; and the general interconnections associated therewith.

Step 16 of methodology 10 was accomplished by the identification of elements 108-112 (i.e., possibly including an actual material movement apparatus); 98, 100 and 106 (i.e., including an actual conveyor and sensor apparatus); 102 (i.e., including an actual robot arm and mechanical pres). Step 18 was accomplished by the identification of control elements 88-96, and step 20 was accomplished by identification of components 72-86.

Since this aforementioned example assumed that no components 72-86 have been previously developed, the answer to the question posed by step 22 must by definition be "no," thusly leading to the requirement of step 26 resulting in the aforementioned message definitions 113-174. Step 28 required that these defined components 72-86 be mapped or placed into one of a plurality of dissimilar simulation systems in the usual manner. Specifically, according to the teachings of the present invention, control elements 88-96 will be mapped into a single control simulation system such as the Flexis system which is available from Savoir Incorporated of Hayward, Ca. The Flexis system will then simulate the operation of these elements 88-96 in a conventional manner. Elements 98-112 will be mapped into a kinematic simulation system such as the Robcad simulation system available from Technomatix, Incorporated of Birmingham, Mich., or into a discrete event simulation system such as the Simal/Cinema simulation system which is manufactured by Systems Modeling Corporation of Sweickley, Pa. The individual simulation system that physical elements 98-112 will be placed within is dependent upon the nature of the element. That is, element 102 which models or represents a typical robotic arm and a typical mechanical press would most likely reside in Robcad due to the complex kinematic nature of its presence within system 70. Physical elements 98-100 and 106 will perform relatively simple repetitive sequential motion type functions and accordingly, these physical elements would most likely be placed within the Siman/Cinema system. The Robcad and Siman simulation system will be used to model elements 98-112 in a conventional manner. Step 28 of methodology 10 has now been completed. The next steps 30 and 32 require the system designer to isolate and test each component 72-86 in the usual manner and to simulate the entire system 70 in the manner previously discussed. Steps 34 and 36 require an estimation of the accurateness of the simulation and an estimation of the degree that the simulation meets the needs of the system 70. Step 38 requires the system designer to document the aforementioned simulation in a typical manner. Thusly, the previously defined partitioning of assembly system 70 has given the reader an example of the use of methodology 10 within an actual system 70 to be simulated and has therefore shown the great utility associated therewith.

III. Simulation Tool Description
(a). Architectural Overview

Figure 7A:
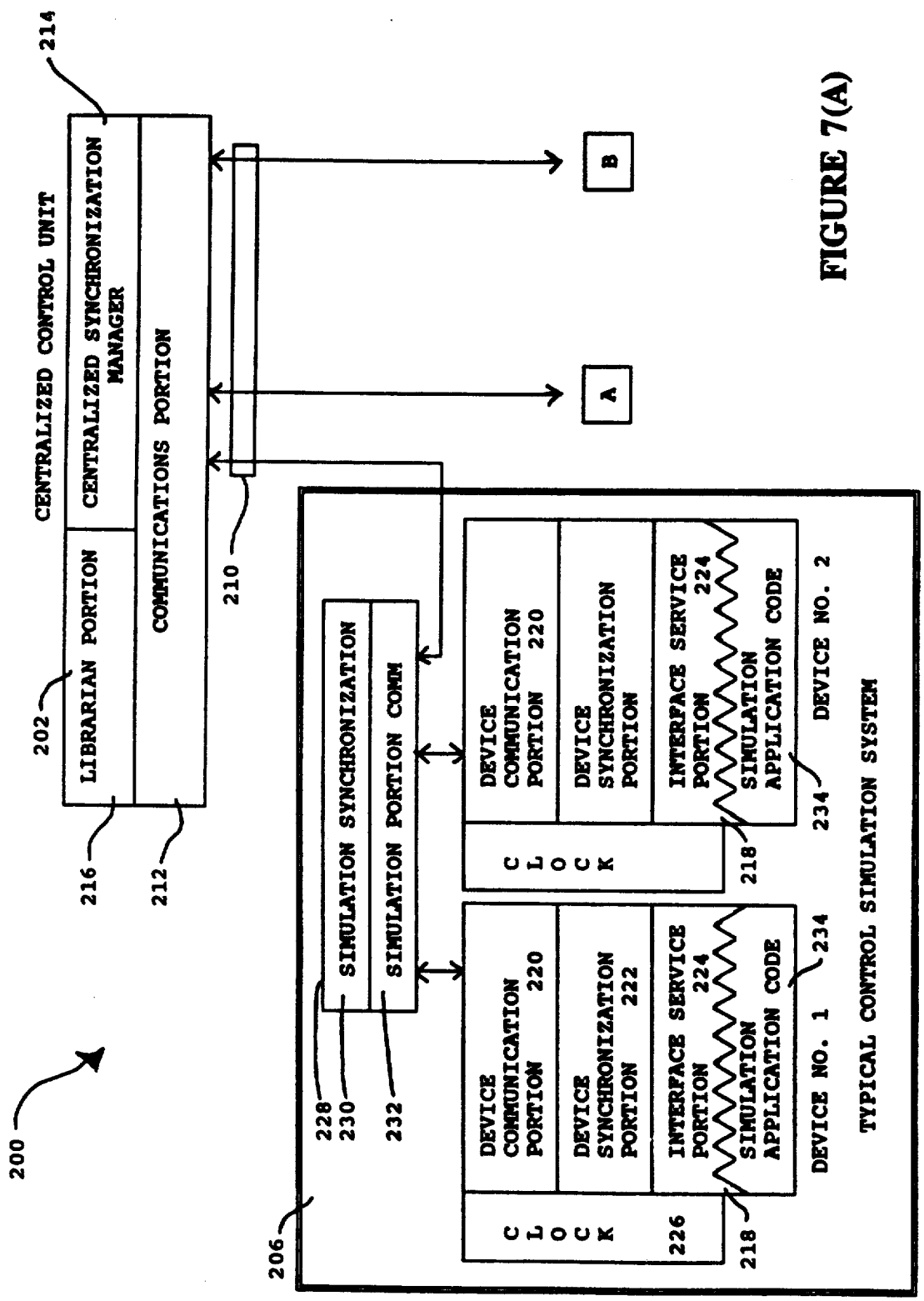
FIGS. 7(A-B) are simplified block diagrams illustrating the simulation tool of the preferred embodiment of the present invention, which may be used in conjunction with any number of dissimilar individual simulation systems such as the three individual systems shown therein.
Figure 7B:
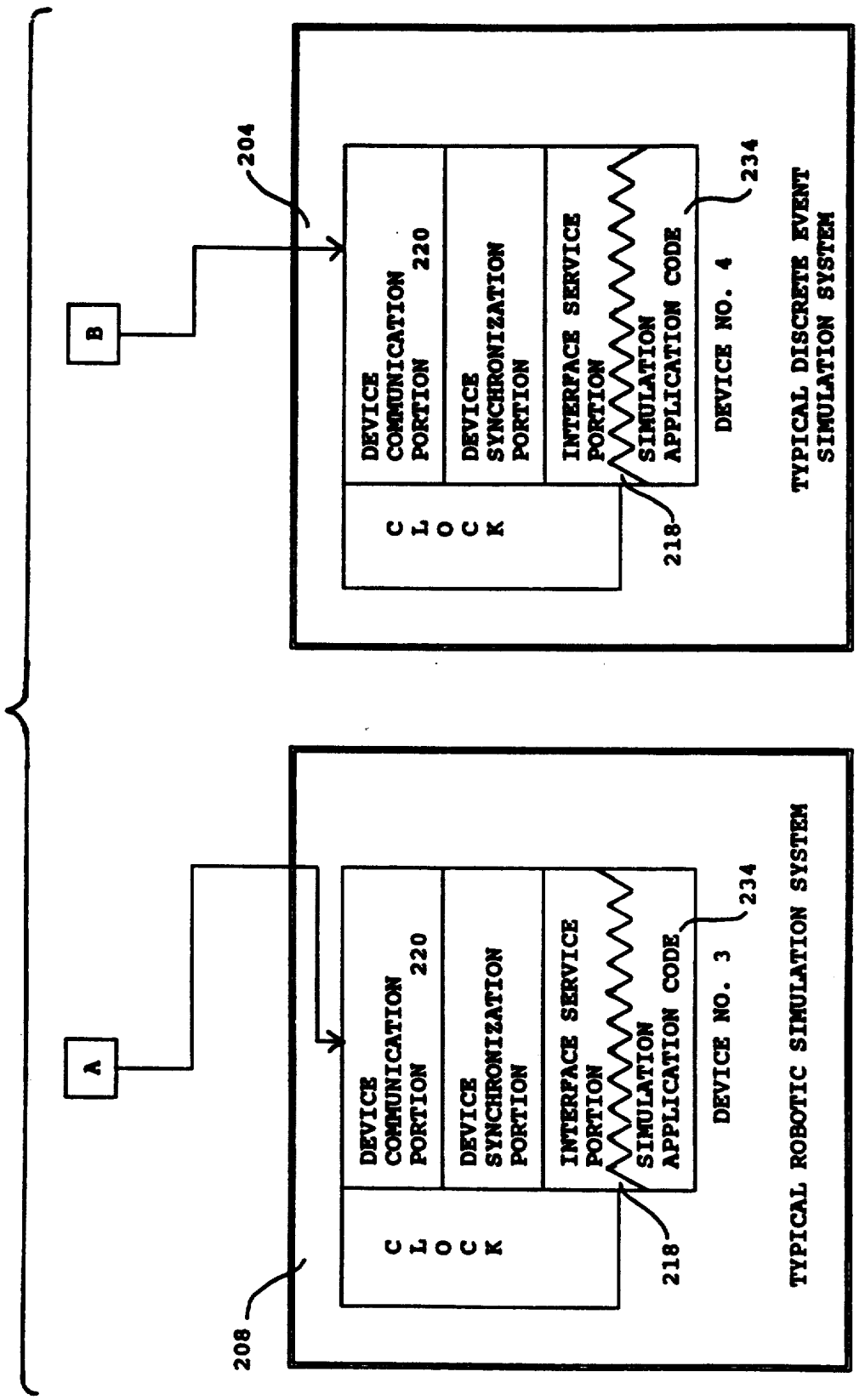

Referring now to FIGS. 7(A-B) there is shown an overall simulation system 200 in which a preferred simulation tool, made in accordance with the teachings of this invention, resides. System 200 is shown as having a centralized control unit 202, a typical discrete event simulation system 204, a typical control simulation system 206, and a typical robotic simulation system 208. Systems 204-208, in the preferred embodiment of this invention, may include the aforementioned Flexis, Siman and Robcad simulation systems respectively and are preferably electronically coupled to unit 202 by a twisted pair wire network 210 utilizing an RS-232C access protocol. Alternatively network 210 may comprise a co-axial cable and utilize the Ethernet of IEEE 802.3, IEE 802.4 or IEE 802.5 standard access protocols, or substantially any other communications network construction and protocol.

The basic hardware of unit 202, in the preferred embodiment of this invention, comprises a standard IBM AT type of personal computer. Provided therein is a communications portion 212, a centralized synchronization manager 214, and a library portion 216. Each portion 212-216 of the central unit 202 resides partly in conventional hardware, and partly in software. Those aspects of the software and firmware which are essential to practicing the present invention will be described in detail further below. In the presently preferred embodiment, portion 212 comprises a Digichannel PC/4 multichannel interface board having four RS-232C output ports and which is available from Digiboard, Inc. located at 6751 Oxford Street, St. Louis Park, Minn., 55426. Portion 212 also preferably contains communications software available from Greenleaf Software Incorporated located at 16479 Dallas Parkway, Suite 570, Dallas, Tex., 75248. the aforementioned software and interface board of portion 212 cooperate to allow portions 214-216 to communicate with systems 204-208 over network 210. Similarly, systems 204-208 each contain one or more devices 218 which comprise one or more elements such as 46 or 50. Each device 218 contains a communications portion 220 which allows these devices 218 to communicate with portion 212 over network 210 by use of the aforementioned RS-232C access protocol.

Connected to each communications portion 220 is a synchornization portion 222, interface service portion 224, and clock 226. In simulation systems, such as 206, containing multiple devices 218, a multi-device synchronization and routing unit 228 is also placed having a simulation synchronization portion 230 and a simulation communications portion 232. The simulation tool of this invention is defined by devices 218 and portions 220-224 thereon, multi-device synchornization and routing unit 228, and centralized control unit 202.

Communications portion 212 allows messages 54-60 to be sent between devices 218 while portion 214 insures that devices 218 will act upon received messages 54-60 in a specified time, so as to provide full interaction between devices 218 and hence between systems 204-208. Library portion 216 allows for the storage and retrieval therefrom, of defined elements 44-46 and 50-52 which are used to construct devices 218 and associated developed simulation code used in conjunction therewith.

Unit 228 allows messages 54-60 to be sent between devices 218 residing in a single simulation system 206 and further allows these routed messages to be synchronized in a manner therein specified by means of portion 230. Further, unit 228 is electronically coupled to unit 202 by means of network 210 and is in communication therewith so as to make it appear to unit 202 as if system 206 contained only a single device 218. Thusly, unit 228 is responsible for routing and synchronizing all of the devices 218 within system 206 and its use allows devices 218 of system 206 to interact in a more efficient manner since the synchronization control 228 is logically closer and dedicated to them.

Further, clock 226 of each device 218 keeps independent simulation time associated with the particular device 218 that it is associated with. The time of clock 226 is used with reference to the synchronization information associated with portions 230 and/or 214 in order to regulate the response of a device 218 relative to a received message 54–60.

Portion 220 allows a device 218 to send and receive messages 54–60, portion 222 cooperates with either portions 230 or 214 and allows a device 218 to be synchronized by portions 230 or 214 in the manner previously specified, while portion 224 allows a simulation system 204–208 to utilize the simulation tool of the preferred embodiment of this invention by use of its native programming language arranged in the form of typical simulation application code 234.

III (b). Messaging

As used by the simulation tool made in accordance with the preferred embodiment of this invention, messages 54–60 of FIG. 2 may be of three general types. The first type is defined as "CRQ" messages, and these require a response by the receiving element upon receipt of the "CRQ" message. The response is defined as a "FRS" type of message, and represents a second message type. The third message type is a "CMD" message which requires no response from the receiving mode and may be thought of as a simple command.

Associated with each "CRQ" type of message 54–60 is a specified method which defines the action or parameters necessary to enable the receiving element to properly act upon the given message 54–60. There are two general types of methods used within the preferred simulation tool made in accordance with the teachings of this invention. The first method is a demand method which is activated or accomplished upon receipt of a "CRQ" message. The second method is a continuous method which begins automatically when the simulation of the simulation system in which the element is placed begins, and is performed as needed thereafter.

Figure 8:
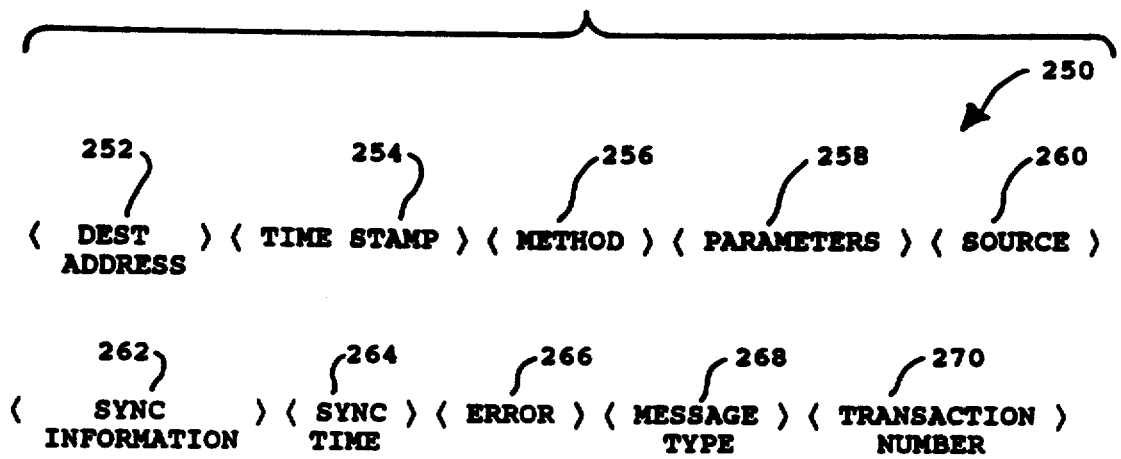
FIG. 8 is an illustration of a typical message format associated with messages of the simulation tool shown in FIGS. 7(A-B).

Before discussing the detailed operation of overall simulation system 200, it is necessary to further discuss the structure of messages 54–60 therein. Referring now to FIG. 8 there is shown a standard message 250 format to be used between devices 218 of systems 204–208. Typical message 250 may be considered to be an example of any one of the messages 54–60. Message 250 contains, in the preferred embodiment of this invention, ten fields 252–270. Field 252 defines an identification address of an element 44–46 and 50–52 within a device 218 that is to receive the message 250. Field 254 defines a simulation time upon which the actions or method represented by message 250 must occur. Field 256 defines the method or actions to be performed by the receiving element. Field 258 defines the parameters or variables associated with the action to be performed such as speed, distance, or the like. Field 260 defines the address of the element initiator of the message. Field 262 defines a synchronization information field which represents a unique sequential number attached to every message 250 by the centralized synchronization portion 214 or by portion 230 (the purpose of which will be explained hereinafter). Field 264 specifies a synchronization time, which defines the maximum time that the individual simulation system 204–208 may simulate to. Field 266 is used to place standard error correcting code information such as parity bits or cyclical redundancy coding. Field 268 defines the type of message that message 250 represents such as a previously specified "CRQ" or "FRS" type while field 270 represents a number that is used to match a "FRS" type of message 250 with an associated "CRQ" type of message 250.

In one transportation scenario, messages 250 normally travel from one of the simulation systems 204–208 through network 210 and to unit 202 through communications portion 212. Thereafter, the message 250 travels through centralized synchronization manager portion 214 where it may be rerouted to a particular one of the systems 204–208 or it may be used to access library portion 216. Transportation scenarios using other routes of communication are possible however. These scenarios include, for example, the generation of a message 250 which is either a "device start" or a "device done" type of message 250, if an element within a device 218 should with to send a message 250 to itself, if the message 250 is generated by an element within a single simulation system 204–208 to another element within the same simulation system 204–208, or if the message 250 is generated by an element within a single device 218 to another element within the same device 218.

Figure 9:
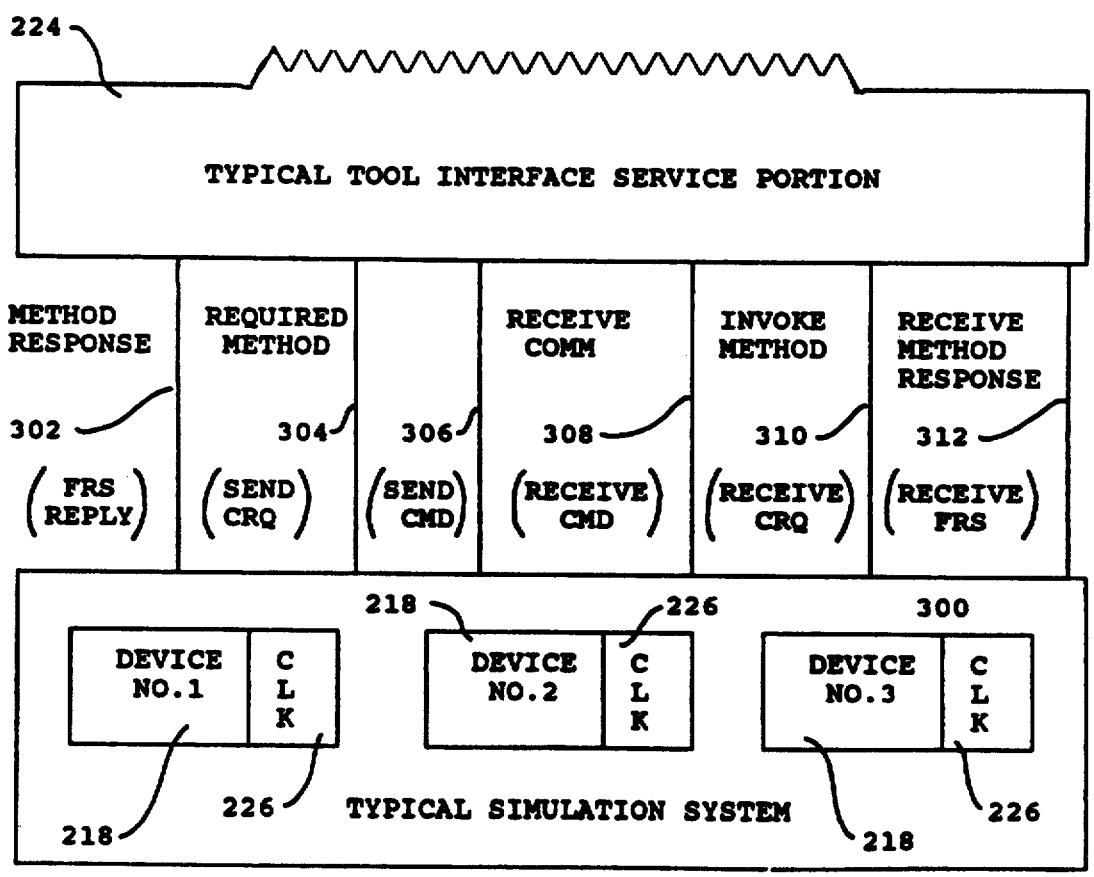
FIG. 9 is an illustration of command primitives between a typical simulation system and a simulation tool interface.

As previously stated, a "device" 218 of system 204–208 may be thought of as a collection of related elements and an individual simulation system 204–208 may be thought of as containing a plurality of such devices 218 therein as shown in FIGS. 7 and 9. Each element 44–46 and 50–52 is a software module in one of the systems 204–208 and is independently and concurrently executable relative to the procedure specified in field 256 of message 250. Each device 218, as stated, has a separate clock portion 226 resident therein which keeps track of the current device simulation time and starts and stops the execution of elements 44–46 and 50–52 therein. The main objective of the synchronization process associated with units 214 or 230 is to ensure that the field 254 of the received message 250 is never less than the simulation time on any of the devices 218 as specified by is clock 226. This ensures that each device 218 will never have to back up to a previous state and time.

Referring now to FIG. 9, there is shown a typical simulation system 300 (which may be substantially similar to simulation systems 204–208) and which is electronically coupled to an interface service portion 224 and has a plurality of typical devices 218 therein. Each device 218 has, as before, a separate clock portion 226. System 300 communicates with interface portion 224 in its own native programming language by means of primitive signals 302–312. Thusly, simulation programming code may be developed by means of the typical native language of the simulation system 204–208.

That is, signal 302 represents the response required of elements 44–46 and 50–52 within devices 218 to a particular received method associated with field 256 of message 250. This is associated with a "FRS" type of message 250. Signal 304 represents a request from a contained element that a method be executed upon another element. This represents a "CRQ" type of message 250. Signal 306 represents the generation of a command to another element. No response to this command is required, and thus signal 306 represents a "CMD" command message 250. Signal 308 represents the reception of a command from another element, and a service to suspend execution of the target element until a particular command has arrived is also provided. Signal 312 represents a response to a previously generated signal 304 and denotes the fact that a requested method has been received by the target element and the method specified in field 256 of the previously generated message 250 has been invoked. Signal 310 represents that a message 150 of the type "CRQ" has been received.

Devices 218 may be started or initialized by the generation of a "start device" message type 250 from portion 214 or from portion 230 to synchronization portion 222 of the device 218 that is to be started. In this form of message 250, field 252 contains the device 218 address which is to be initialized, field 254 is null, field 256 contains a "device start" method, field 258 is null, field 260 contains the address of portions 214 or 230, field 262 is set to one (because it's the first message after the last "device done" message) field 264 is set to the maximum level that clock 226 of the device 218 to be started will allow, field 266 contains a standard error correcting code, field 268 contains a "start" message type, and field 270 is null. In the preferred embodiment of this invention, the addresses of unit 202, individual systems 204-208, portions 212-216, and all devices 218 and associated elements 44-46 and 50-52 contained therein may be initially programmed into the synchronization portion 214 or 230 such that these addresses may be utilized in fields 252 and 260 of messages 250. Alternatively, only the addresses of portions 212-216 may be programmed initially into portion 214, with all other addresses registering with portion 214 thereafter.

The second type of message 250 that requires no traversal through the unit 202 is that of "device done." A "device done" type message 250 is sent to portion 214 or 230 when one of the devices 218 has completed the required processing defined by a previously received message 250, but no outgoing message 250 has been generated from any of the elements 44-46 and 50-52 contained therein at that time. Message 250, in this form, has field 252 equal to the address of portion 214 or 230, field equal to null, field 256 equal to a "device done" method, field 258 equal to null, field 260 equal to the address of the device 218 that has completed a received method field 256, field equal to the value of the last synchronization information field 262 received, field 264 equal to the maximum time that the device 218 may simulate to without sending an external message, field 266 equal to a standard error correcting field as specified earlier, field 268 equal to a "done" message type, and field 270 equal to a null. Alternatively, both the "done" and "start" message types may represent standard message 250 types that do traverse through unit 202. That is, fields 262 and 264 may be appended to typical messages 250 within system 200.

The third type of message 250 that does not need to be routed through unit 202 is that of an element 44-46 and 50-52 therein generating a message 250 to itself. In this type of message 250, fields 252 and 260 are substantially similar and both contain the address of the element or device 218 generating the message 250, fields 254-258 are filled in or defined as needed and fields 262-264 are null. Additionally, field 266 contains standard error correcting parameters as before, field 268 contains a self issue message type, and field 270 is null.

The fourth message 250 type that doesn't need to traverse unit 202 is that of an element generating a message to another element within the same device 218 or same simulation system 204-208. In this type of message, fields 262 and 264 are null and field 252-258 and 266-270 are as earlier specified. The generation of messages 250 between elements residing within devices 218 which are within the same system 204-208 will be later explained in section III(c) of this discussion related to the hierarchial distribution of synchronization units.

In operation, after all of the devices 218 of systems 204-208 have been initialized, elements 44-46 and 50-52 contained therein may be made to generate primitive signals 302-312 in order to create messages 250 to other elements 44-46 and 50-52 of device 218 so as to effect an entire simulation. These signals 302-312 are generated by the use of the native programming language of each simulation system 204-208 in the typical manner associated therewith. Signals 302 and 304 contain address information of the address of the destination and generating element of device 218 as well as needed methods, parameters, and time to be completed.

As signal 302-306 is generated, interface portion 224 receives the same and impresses said signals 302-306 upon portion 222 which appends local synchronization information and synchronization time information to the aforementioned data contained within signals 302-306 and then passes this information bundle to communications portion 220. Portion 220 then packages the information therein into the form shown in message 250 and electrically impresses this information onto network 210.

If the message 250 is to be sent to an element residing within a device 218 outside of the system 204-208 containing the sending device 218, this impressed information is then routed to centralized control unit 202 and is received by portion 212 therein which transforms the electrical signals to computerized coded information and passes this to centralized synchronization manager portion 214. This message 250 is then routed back to network 210 through portion 212. Message 250 is then received by portion 220 of the device 218 that contains the element specified within field 252 in the original generated message 250. Fields 262 and 264 are set to a new value in this process by portion 214.

Thereafter, the received information is passed through portions 222 and 224 of the target device 218. The method specified within field 256 is then accomplished by the selected element within device 218 at a time specified by field 254 as interpreted by the contained clock 226 of device 218.

It should be appreciated by one of ordinary skill in the art that a plurality of messages 250 may be created, generated, routed, and received in a like manner by devices 218 of systems 204-208 and that these message 250 in cooperation with clocks 226 will allow these multiple simulation systems 204-208 to be interactively coordinated such that a single overall system simulation is realized.

The use of synchronization information field 262 will now be explained in greater detail. Specifically, field 262 is used to solve a potential race condition between portion 214 and a device 218. That is, there exists a distinct possibility that a message 250 containing a method to be accomplished could be sent to a specific device 218 at substantially the same time that the specific device is issuing a "device done" type message 250 to portion 214. Without any additional information, portion 214 might be led to believe that this aforementioned "device done" type message 250 pertains to its recently issued message 250 instead of pertaining to one issued earlier. To avoid this problem, centralized synchronization portion 214 generates a unique message 250 number (by incrementing a value stored in its typical memory or a register), and places it in each message 250 it sends out. Also, each of the devices 218 is required to place into field 262 of each "done" message 250 it generates, the contents of field 262 from the last message 250 that it received. Then, portion 214 can and will compare the value of this field 262 to the value of field 262 of the message 250 last sent to this specific device 218 to determine if they are the same. If they are not the same, then portion 214 is made to expect at least one more "done" type message corresponding to its sent message 250 most recently sent to the specific device.

III (c). Devices

To gain a more complete understanding of the operational aspects associated with the simulation tool and the synchronization of devices 218 of the preferred embodiment of this invention, a discussion will now ensue as to the behavior of such devices 218 within individual simulation systems 204– 208. Generally, there are three types of devices 218 within the systems 204–208. These devices 218 may be of the discrete event type, the continuous time type, or the zero time type. Specifically, the Siman simulation system, for example, contains discrete event devices, the Robcad simulation system contains continuous time devices, and the Savoir simulation system contains zero time devices.

Figure 10:
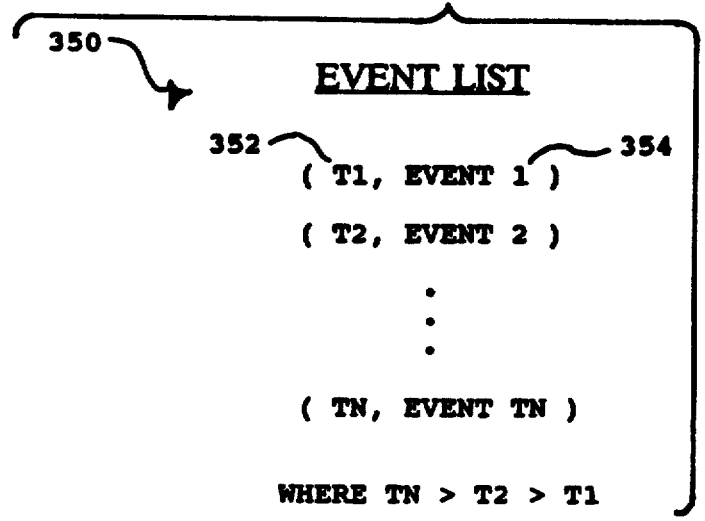
FIG. 10 is an illustration of an event list of a typical discrete event simulation system.

A discrete event device 218 maintains an event list 350, which, as generally shown in FIG. 10 and which is comprised of pairs of associated parameters 352 and 354. The parameters 352 define a simulation time and event parameter 354 defines the required, associated simulation action. These pairs 352 and 354 are sorted chronologically in ascending order of time (i.e., with the earliest pair first). When the first event action 354 is executed by an element within a discrete event device 218, the simulation time contained in its clock 226 is advanced at that execution time to the time 352 associated with the event 354. When the next event 354 in list 350 is executed, clock 226 is then again advanced to the corresponding simulations time 352. This process continues until all of the events 354 within list 350 have been executed.

A continuous time device 218 is characterized by the simulation time associated with its clock 226 advancing in equally spaced steps such that all actions requested of the device 218 by any of the individual systems 204–208 will be performed by the device 218 only at these incremental points in time. From a simulation standpoint, the simulation system 204–208 having such a continuous time type of device 218 is static between these interval points. Two types of typical continuous time devices 218 are used by this invention. These two types are the incremental continuous and the jump continuous type. The preferred embodiment of this invention utilizes a jump continuous device instead of the incremental continuous device because it is known that the jump continuous device reduces the number of messages 250 between devices 218.

In a zero time device 218, substantially all of the processing occurs within a substantially zero amount of simulation time as interpreted by clock 226 contained within the device 218. Thus, a zero time device will generate all responses to a stimulus or a method contained within a received message 250 at substantially the same simulation time in which performance of the response or method commences.

Each device 218, in addition to containing a clock 226 and a plurality of elements 44–46 and 50–52 therein, contains and updates four system time variables. These variables are denoted as $t_i$, $t_{negotiate}$, $t_{increment}$, and $t_{stop}$, where $t_i$ contains the current simulation time associated with clock 226 and is continuously updated therefrom; $t_{negotiate}$ contains the proposed time that the device 218 could simulate to if it were isolated within the overall simulation; $t_{increment}$ defines the increment of time associated with a continuous device that determines how long the time intervals are; and $t_{stop}$ defines the time that the device is allowed to simulate to. In general, no message 250 may be processed by any of the aforementioned devices 218 unless the simulation time specified in its field 254 is greater than or equal to the value of $t_i$ associated with the receiving device 218. The use of these system time variables will now be generally explained.

If the discrete event device is in a "done" state, it must receive a "start" type message 250 having the usual sync time field 262 therein. This "start" type message 250 may be generated directly from a synchronization portion such as 214 or may be coupled with standard message 250 emanating from an element within another device 218 by appending field 262 and 264 thereto in the previously specified manner.

Upon receipt of the "start" type message 250, the discrete event device 218 will set its variable of $t_{stop}$ and $t_i$ to be substantially equal to field 264 of the "start" message 250 and at this point the device 218 will execute its next event 354 upon event list 350 having a time 352 equal to $t_{stop}$.

If the "start" message 250 was a standard type message or if other messages 250 are received by discrete event device 218 after it has been started in the aforementioned manner, then all methods represented by these message 250 having a field 254 equal to the value of $t_i$ are processed and those having a field 254 greater than the value of $t_i$ are placed upon event list 350. Additionally, device 218 stores, as hereinbefore specified, the fields 262 associated with received messages 250 having fields 254 equal to $t_i$ to be used in the previously specified manner. If an element within the discrete event 218 generates a message 250 addressed to an element outside device 218, message 250 is written to an external port and buffer it for transmission thereto.

When all events that can be processed at a time of $t_i$ are completed, the discrete event device 218 is "done" and if there is a message 250 still to be transmitted as a result of this processing, event device 218 sends this message 250 with field 262 equal to the value of the field 262 associated with the last message 250 received by it and having field 264 substantially equal to the time 352 associated with the next event 354 on the event list 350. If there are no messages 250 within the buffer, the discrete event device 218 sends a "done" type message 250 having fields 262 and 264 as herein specified to unit 202 or to an intermediate synchronization unit 228 (to be discussed in section III(c) hereinlater.

In the case of a zero time device 218, all messages 250 must have a $t_{stamp}$ field 254 substantially equal to $t_i$ until the device 218 is done. If the zero time device 218 is done, a "done" type of message 250 is issued by the device 218 having field 264 indicating infinite time. A zero time device 218 is substantially never sent a "device start" type of message 250 since such a device 218 almost always effectively processes messages 250 immediately upon receipt thereof. Externally bound messages 250 are buffered within devices 218 while messages 250 destined to an element 44-46 and 50-52 contained therein and having $t_{stamp}$ field 254 substantially equal to $t_i$ are routed and immediately executed. Messages 250 having field 254 greater than $t_i$ and sent between elements residing in the same zero time device 218 are buffered and sent to portion 214 to be stored until returned thereto for processing.

Generally, an incremental continuous device may receive a message 250 having field 264 equal to either $t_i$ or to $t_i+$[some arbitrary time denoted as "t"]. If field 264 is greater than $t_i$, this kind of continuous device 218 will advance its clock by an amount of $t_{increment}$ and will execute messages 250 having the contents of its field 254 substantially equal to $t_i$.

If the incremental continuous device 218 was done and a "start" type of message 250 is received, $t_{stop}$ is made substantially equal to field 264 of this "start" message 250. If $t_{stop}$ is greater than $t_i$, the incremental continuous device 218 will continue to execute until $t_i=t_{stop}$. This execution usually involves the use of a difference equation. Lastly, the last message 250 sent therefrom is made to have a synchronization information field 262 substantially equal to the field 262 contained within the last received message 250.

Messages 250 are processed, by the incremental continuous device 218, as described before wherein outgoing messages 250 are buffered until generated therefrom. The buffering includes messages 250 which are destined for internal elements 44-46 and 50-52, if the messages 250 have a $t_{stamp}$ field 254 greater than $t_i$. Messages 250 having field 254 substantially equal to $t_i$ and destined for internal elements 44-46 and 50-52 are immediately processed therein.

If "done", a jump continuous device 218 will perform simulations after receiving a "start" type message 250 until either one of the elements of the device 218 sends out a message 250 to one other element outside of device 218 or the contained simulation clock 226 reaches $t_{stop}$. The variable $t_{stop}$ is set equal to the synchronization time field 264 of the incoming "start" type message 250. In either case the advancement of the contained simulation clock 226 is halted until the next "start" type message 250 is received. Message 250 may still be received at this point however these messages must have a $t_{stamp}$ field 254 equal to $t_i$ and, in this phase, it should be noted that the device 218 behaves like a zero time device 218.

It should further be noted that the synchronization time field 264 is defined differently in a jump continuous device than in all the other types of devices. That is because when the jump continuous device 218 is in a "done" state and a final message 250 from the device 218 is sent, the value of synchronization time field 264 therein represents the current value of the simulation clock 226 within the device 218, instead of how far in advance the jump continuous device 218 may simulate to. This is done so that the central synchronization portion 214 will know how far the rest of devices 218 may advance in simulation time before the jump continuous device 218 may advance again.

In the jump continuous devices 218, each incoming message 250 is processed as it arrives, as long $t_{stamp}$ is greater than $t_i$. Processing within this type of device usually involves the solution to a plurality of difference equations. Processing is continued until either $t_i$ is equal to $t_{stop}$ or the device 218 generates its first external message 250 in which case $t_{stop}$ is substantially equal to the time at which the message 250 is sent.

Figure 11:
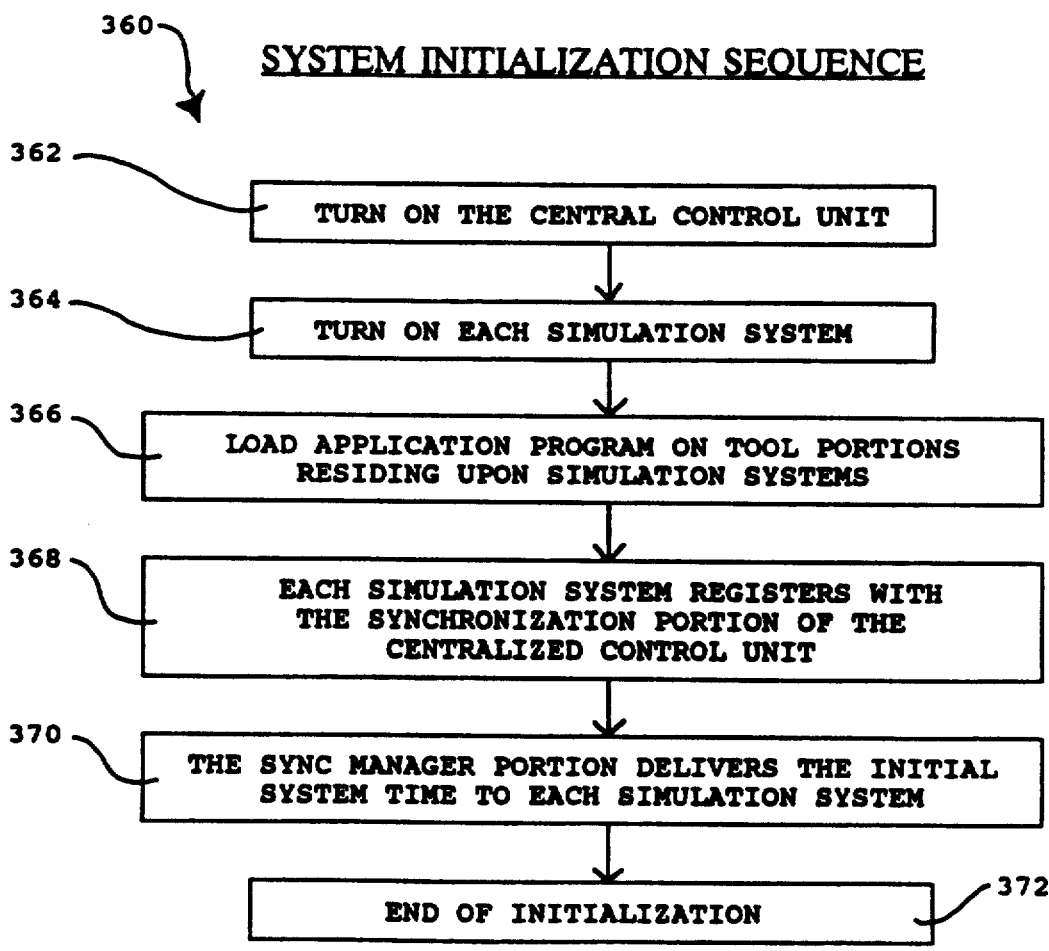
FIG. 11 is a flowchart illustrating a sequence of steps associated with the initialization of the simulation tool and simulation systems shown in FIGS. 7(A-B).

Referring now to FIG. 11 there is shown a flowchart 360 detailing an initialization sequence associated with the simulation tool made in accordance with the teachings of the preferred embodiment of this invention. The first step 362 in the sequence 360 is to turn on or activate the centralized control unit 202 thereby allowing portions 212-216 to communicate through network 210.

The next step 364 requires the activation or turning on of all simulation systems 204-208 sequentially including units 228 and devices 218. Next, step 366 requires the loading of the application program developed in the native programming language of each simulation system 204-208 wherein said program is electronically coupled to an interface 224 of a device 218. Such loading may occur by normal procedures associated with each system 204-208 or from library portion 216 and the program causes the generation of signals and allows the reception of signals 302-312 shown in FIG. 9.

Step 368 then requires the registration of each simulation system 204-208 with the centralized synchronization manager portion 214 and/or portion 230. Examples of information contained within the registration process is information concerning the address of each device 218 including device type (i.e., zero time, discrete event, or continuous), the address of every element within the device, and the initial simulation time according to clock 226 contained within each of the devices 218. Portion 214 (or 230) will then subsequently collect this information and build a routing table. A $t_{negotiate}$ value is also sent, during this time by each device 218, to portion 214 (and/or to portion 230) which uses this information in step 370 to deliver an initial system time to each of the devices 218 residing within systems 204-208. Upon completion of step 370, sequence 360 enters step 372 which defines the end of the initialization sequence and normal processing may proceed as heretofore described. It should be noted that elements 44-46 and 50-52 of devices 218 may be stored within library portion 216 after initialization has been completed. These stored elements may subsequently be downloaded to each system 204-208 thereby defining a plurality of devices 218 therein.

III(d). Synchronization

Figure 12:
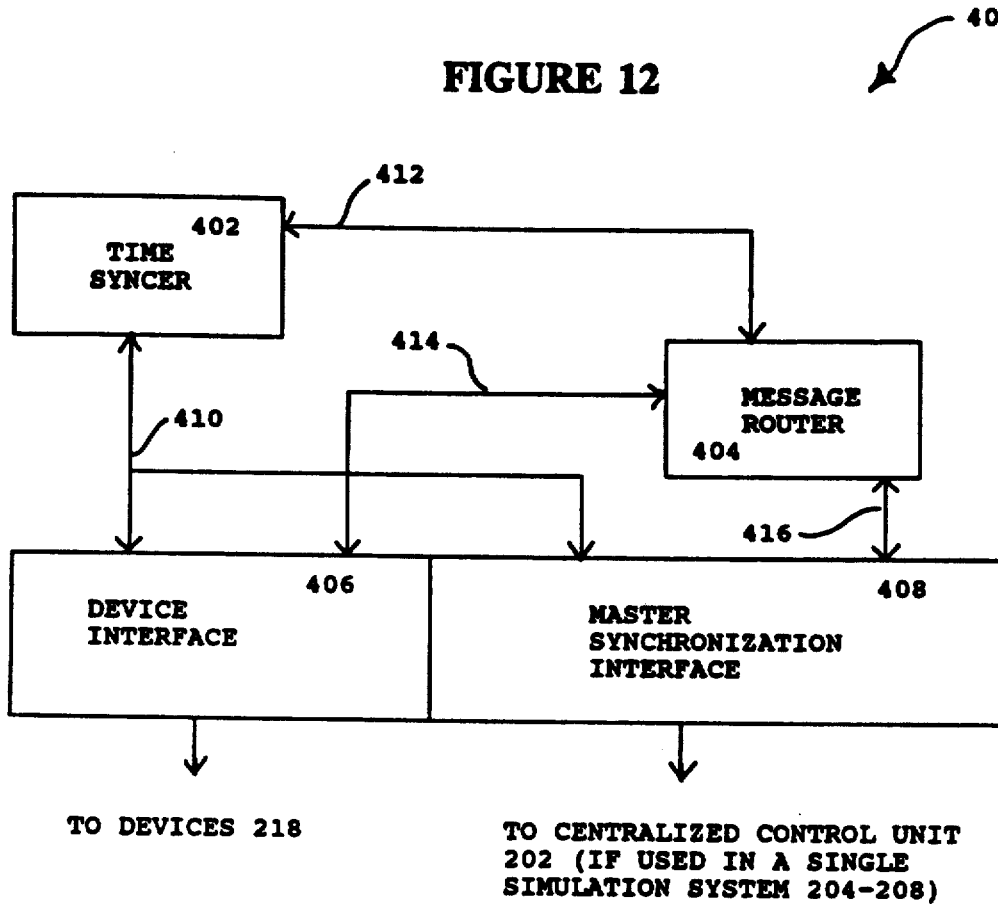
FIG. 12 is an illustration of a typical synchronization unit made in accordance with the teachings of the preferred embodiment of this invention.

Referring now to FIG. 12, there is shown a typical synchronization unit 400 which is substantially similar to either unit 228 or to the combination of portions 212 and 214 of the centralized control unit 202. Thusly, units 400 may be hierarchically distributed within system 200 in the manner shown in FIGS. 7(A-B). That is, portions 212 and 214 as shown therein are hierarchically placed at a higher level (i.e., central synchronization) than is unit 228 although both have substantially the same architecture as shown in FIG. 12. Specifically, general synchronization unit 400 contains a time syncer portion 402, a message router portion 404, a device interface portion 406, and a master synchronization interface portion 408. The four previously mentioned time variables t, $t_{stop}$, $t_{negotiate}$, and $t_{increment}$ are used within unit 400 and (with the exception of variable $t_i$) have substantially the same interpretation as described (hereinearlier) with reference to devices 218. In units 400, the variable $t_i$ represents the maximum simulation time that any of the subordinate devices 218 may simulate to. Additionally, unit 400, if used in the manner of unit 228, also contains a variable referred to as "last sync info" and reflects the value associated with the last sync info field 262 contained in a message 250 received from a synchronization portion placed hierarchically above it (i.e., portions 214 and 212). There is also present, within unit 400 a "sync info" counter variable associated with every device 218 attached to portion 406.

Interface 406 generally controls the devices 218 to which it is attached. It starts the attached device by the generation of the previously specified "Device Start" message type 250 when time syncer 402 issues a "start" signal on line 410 thereto or when a message 250 whose $t_{stamp}$ field 254 is less than or equal to the value of the variable $t_i$ of unit 400 is routed to it from another device 218. Interface 406 also monitors all attached devices 218 and informs time syncer 402 of the current status of attached devices 218 by signal on line 410.

As noted, units 400 may be hierarchically distributed within system 200. In the hierarchical architecture illustrated generally in FIGS. 7(A-B), portion 406 of general synchronization unit 400 would be electronically coupled to devices 218 of system 206 while portion 408 of unit 400 would be electronically coupled to unit 202 if one wished to use general synchronization unit 400 in substantially the same manner as unit 228 in FIGS. 7(A-B). Similarly, if one wished to use general synchronization unit 400 in substantially the same manner as the combination of portions 212 and 214 of FIGS. 7(A-B), one would electronically couple portion 406 of unit 400 to unit 228 thusly causing portion 406 to view unit 228 as a single subordinate device.

Upon receipt of message 250, portion 406 examines field 262 associated therewith and if field 262 is substantially equal to the value of the "Sync Info" counter for that device 218, determines that this is a "done" type message 250 and then signals a "Done" type message 250 to syncer 402 by signal on line 410 and will set the next event associated with the generator of the message 250 to infinity if the generator of the message 250 was a device 218 of the jump continuous type, otherwise the next event is set to field 264 of the received message 250. Additionally, the "Sync Info" counter variable is then set to zero.

However, if upon receipt of the message 250, the message generating device is the jump continuous type and the message 250 is a "done" type message 250 (ie. the value within field 262 is equal to the value of the "sync Info" counter variable for that device 218), then unit 400 recalculates $t_{stop}$ to be substantially equal to the minimum of the old value of $t_{stop}$ and the field 264 of the received message 250. Also $t_i$ is made to be substantially equal to $t_{stop}$. Lastly, if the received message is destined for another device 218, indicated by address field 252, then the message 250 is forwarded to router 404 by signal on line 414.

Message router 404 may also send a message 250, by signal on line 414, to interface 406. If a message 250 is sent in this manner, then field 264 of that message 250 is made to be substantially equal to $t_i$ if the "Sync Info" counter variable for the device 218 indicated by field 252 is zero, otherwise field 264 is set to zero since the target device 218 doesn't need to be started. Additionally, portion 406 informs syncer 402 by running and increments the "Sync Info" counter variable and sets field 262 of the message 250 to this incremented value. Lastly, portion 406 sends the aforementioned modified message 250 to the target device 218 (i.e., or possibly a subordinate synchronization unit).

Upon receipt of a "start" type message 250 from syncer 402, portion 406 increments the "Sync Info" counter variable for the device 218 indicated by field 252 and creates and sends a "Device Start" type message 250 having a field 262 substantially equal to the value of the incremented "Sync Info" counter variable and having a field 264 substantially equal to $t_i$.

Time syncer portion 402 monitors all devices 218 or hierarchically subordinate units (i.e., such as 228) attached to portion 406. When all units or devices attached to portion 406 are done, portion 402 calculates a new value for $t_{negotiate}$ and informs portion 408 that portion 402 is "done." Additionally, portion 402 propagates the previously defined "start" type message 250 received from portion 408 to the appropriate units or devices electronically coupled to portion 406.

Specifically, upon receipt of a "done" type message 250 from portion 406, portion 402 saves the "Next Event" time for the "done" device 218 from field 264 associated with message 250. When all of the subordinate units 228 or devices 218 ar "done" that are attached to portion 406, portion 402 sets the value of $t_{negotiate}$ to be substantially equal to the minimum of the next event value of all of the devices 218 or units 228 and the value of the $t_{stamp}$ variable of the next message 250 on the event list (if unit 400 has one). That is, if unit 400 is characterized as a discrete event type of unit then it must support a separate event list if all of the units or devices attached to portion 406 are not of the discrete event type. Subsequently, portion 402 will send a "done" type message 250 to portion 408.

Upon receipt of a "start" type message 250 from interface 408, portion 402 will send a "start" type message 250 to portion 406 having its field 264 set to be substantially equal to the value of the variable $t_{stop}$ if there is a jump continuous unit or device attached to portion 406. When the jump continuous device 218 is done, portion 402 will direct portion, 404 by signal on line 412 to process any events 304 on its event list 350. If unit 400 has any discrete event or incremental continuous type of units 228 or devices 218 attached to portion 406, then portion 402 will send "start" type messages 250 to those discrete event or incremental continuous units 228 or devices 218 who have their next event scheduled at a time denoted by the value of $t_i$, if they have not already been started by the aforementioned processing of events.

Message router portion 404 generally routes messages 250 and manages the defined event list (if one is needed). Upon receipt of a signal from portion 402 on line 412, ordering the processing of an event upon the event list, router portion 404 will route any messages 250 scheduled on the event list which are associated with time $t_i$.

If portion 404 receives a message 250 addressed to a device 218 not attached to portion 406, then portion 404 sends it to portion 408. If portion 404 receives a message 250 that is addressed to one of the elements of devices 218 or units 228 attached to portion 406 then portion 404 routes the message 250 directly if field 254 therein is substantially equal to the value of $t_i$ or if field 254 is greater than the value of $t_i$ and if the target device 218 or unit 228 is a discrete event type. If field 254 within the received message 250 is greater than $t_i$ and the target device or unit is not a discrete event device and there is an event list within unit 400, then portion 404 places this received message 250 upon that event list. If field 254 is greater than $t_i$ and the target device 218 or unit 228 is not a discrete event type and there is not event list within unit 400, then unit 400 will route message 250 out of portion 408 to be stored by a different but analogous unit 400 having an event list therein.

Interface portion 408 generally interprets the Sync Info field 262 and Sync Time field 264 in the messages 250 coming from portion 214 of centralized control unit 202, which is hierarchically placed above it and then inserts these field 262 and 264 in messages 250 emanating therefrom.

Upon receipt of a message 250 from a unit 202, and if unit 400 is "done", then portion 408 sets the variable $t_{stop}$ to be substantially equal to field 264 and marks the unit 400 as running. If unit 400 is a discrete event, zero time, or incremental continuous type of unit than the variable $t_i$ is set substantially equal to the variable $t_{stop}$. If the unit 400 is a jump continuous type than $t_i$ is incremented by $t_{increment}$. Subsequently, a "start" type message 250 is sent to portion 402 by signal on line 412. Additionally, portion 408 contains a variable denoted as "Last Sync Info" which represents the value of field 262 contained in the last received message 250 from a unit such as 202. Upon receipt of such a message 250, this variable is updated to reflect the current value of field 262 therein and, lastly, if the message 250 is directed to another device or unit, portion 408 sends messages 250 to router 404 by signal on line 416.

Upon receipt of a message 250 from router 404 by signal on line 416, portion 408 buffers it and if there is another current message 250 within the buffer, sends it with fields 262 and 264 being null to the directed or addressed element. Additionally, if unit 400 is of the jump continuous type and if $t_i$ is less than $t_{stop}$, portion 408 will set $t_{stop}$ to be substantially equal to $t_i$ and set field 262 to the value of the last field 260 received in a message 250 and set field 264 to $t_i$. This will halt unit 400 as a result of this outgoing message 250.

Upon receipt of a "done" type message 250 from portion 402, portion 408 (if unit 400 is acting as unit 202) will set the variables $t_i$ and $t_{stop}$ to be substantially equal to $t_{negotiate}$ and will send a "start" type message 250 to portion 402. However, if unit 400 is of the jump continuous type and the value of $t_i$ is less than the value of $t_{stop}$, then portion 408 sets $t_i$ equal to the minimum of $t_{stop}$ and $t_{negotiate}$ and sends a "start" type message 250 to portion 402. In all other cases, if a message 250 is present within a buffer, portion 408 causes this message 250 to be sent having a field 262 equal to the value of the "Last Sync Info" variable and a field 264 equal $t_{negotiate}$. If no message 250 is in a buffer, portion 408 sends a "Device Done" message 250 having a field 262 substantially equal to the value of the "Last Sync Info" variable and having a field 264 substantially equal to $t_{negotiate}$.

IV. Simulation System Interface

The ease of use of the simulation tool of the preferred embodiment of this invention with and by each of the dissimilar individual simulation systems 204-208 is made possible in significant part by the interface service portions 224. A more detailed description of the function and operation of interface portion 224 which is commonly referred to as the "shell", will now be provided.

Shell 224 provides an environment where simulation designers can easily create methods and elements by using the native programming language of an individual simulation system, such as any one of systems 204-208, which allows simulation tool to be substantially transparent to these designers. In the preferred embodiment of this invention, there is placed a unique shell 224 for every device 218 within a unique individual system 204-208. This transparency of individual system 204-208 use is achieved by mapping the signal primitives 302-312 onto native programming language commands by the use of standard computerized mapping techniques which employ standard data structure pointers. These pointers serve to indicate an address location, within systems 204-208, containing native language commands corresponding to signals 302-312.

Native language commands, often called macros or function calls, used within the Savoir simulation tool include "Send CRQ" which is associated with signal 304, "FRS Arrived" which is associated with signal 312, "Send CMD" which is associated with signal 306 and "CMD Arrived" which is associated with signal 308. Other macro or function calls are also provided and are discussed below.

(a). Savoir system

Figure 13:
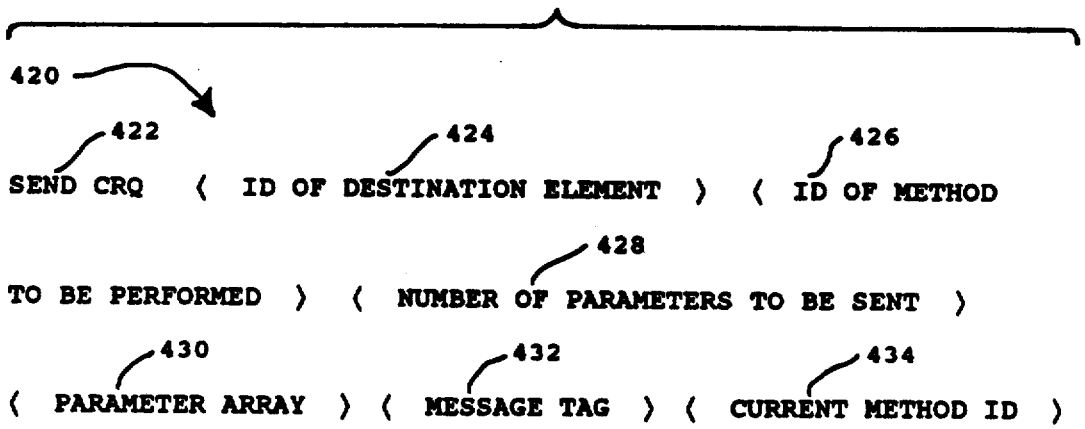

In the preferred embodiment of the invention, the Savoir system designer declares and sets a parameter array in the "C" programming language in order to develop a "C" function call necessary to invoke the "Send CRQ" command. The format of this function call is shown in FIG. 13 as a function call 420 having a function descriptor 422 to which fields 424-434 are appended. Descriptor 422 defines the "Send CRQ" function and is mapped onto signal 304. Fields 424-434 modify the same. Specifically, field 424 defines the address of the destination element to receive the signal 302, field 426 defines the actual method to be performed (this method being resident within the simulation system 204-208), field 428 defines the actual number of parameters to be sent, field 430 defines the actual parameters associated with method field 256 and usually represented by field 258 of message 250, field 432 defines an identification tag number associated with the function call 420 and field 434 defines the current method that is making function call 420.

Referring now to FIG. 14 there is shown a function call 440 associated with the "FRS Arrived" message and including a descriptor portion 442 which is associatively mapped onto signal 312 and having message tag field 444 and current method identifier field 446 associated therewith. Field 444 defines a unique identification number associated with the original function call 420 which caused the generation of the associated "FRS" type message 250 and field 446 defines the identification of the method which made the original function call 420. Descriptor portion 442 is logically true if the associated "FRS" type message 250 was received and is false if it was not.

Another macro or function call that is provided by this preferred embodiment is illustrated in FIG. 15 and is referred to as the "GET FRS PARAM" function call. This function call 450 acts to obtain the parameters associated with an "FRS" message type 250. Specifically, function call 450 contains a descriptor 452 mapped onto interface portion 224 and systems 204-208 and acts to obtain a selected parameter of an "FRS" message type 250. Function call 450 has a message tag field 454 defining a unique identification number associated with the original "send CRQ" function call 420. Function call 450 further has a current method field 456 defining the method which sent the original "send CRQ" function call 420 and a field 458 identifying which parameter is needed to be obtained. The function calls in FIGS. 16-23 are also provided by the simulation tool of this invention relative to the Savoir simulation system and are described below.

Referring now to FIG. 16 there is shown a "Send CMD" function call 460 having a "Send CMD" descriptor portion 462 which is mapped onto signal 306 of systems 204-208 and further having the address of the destination element field 464, field 466 identifying the command of action to be performed, field 468 containing the number of parameters to be transmitted, and field 470 defining the specific parameters to be used by the destination element which are arranged within a typical array.

Referring now to FIG. 17 there is shown a "CMD Arrived" function call 472 containing a "CMD Arrived" descriptor portion 474 mapped onto signal 308 of system 204-208 and having field 476 identifying a particular "CMD" type message 250 that was previously sent. That is, descriptor 474 is logically true if the "CMD" message type 250 previously sent had a field 256 substantially equal to the value of field 476 has been received and logically false if it has not been received. This logical true state remains intact such until it is reset.

Figure 18:

Referring now to FIG. 18 there is shown a function call 484 having a "Get CMD Source" descriptor 486 which is mapped onto interface service portion 224 and systems 204-208 and which obtains the source element address of a "CMD" message 250 previously received a given element and further having a field 256 substantially equal to the value of field 488.

Figure 19:
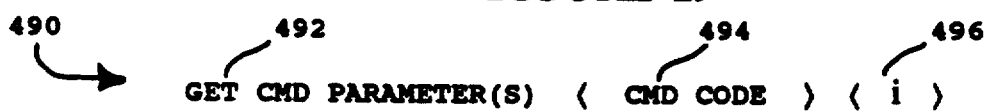

Referring now to FIG. 19 there is shown a function call 490 having a "Get CMD Parameter" descriptor 492 mapped onto interface service portion 224 and systems 204-208 which obtains, the parameter specified within field 496 from field 258 of the last "CMD" type message 250 received having a field 256 substantially equal to the value of field 494.

Figure 20:
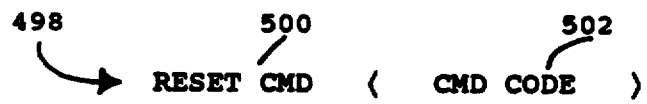

Referring now to FIG. 20 there is shown function call 498 having "Reset CMD" descriptor 500 mapped onto interface service portion 224 and systems 204-208 which resets the indication that a "CMD" type message 250 having a field 256 substantially equal to the value of field 502 has arrived.

Figure 21:
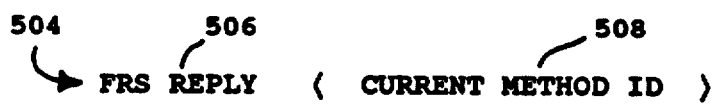

Referring now to FIG. 21, there is shown a function call 504 having a "FRS Reply" descriptor 506 mapped onto interface service portion 224 and system 204-208 and which is used to generate an "FRS" type of message 250 with the method specified in field 508.

Figure 22:
FIG. 22 is an illustration of a "Put FRS" Parameter function call.

Referring now to FIG. 22, there is shown a function call 510 having a "PUT FRS" description 512 mapped onto interface service portion 224 and systems 204-208 and which causes the parameter identified by field 516 having a value identified by field 518 to be placed in the "FRS Reply" message type 250 generated as a result of function call 504. Field 514 identifies the method placing these parameters in the "FRS Reply" message type 250.

Figure 23:
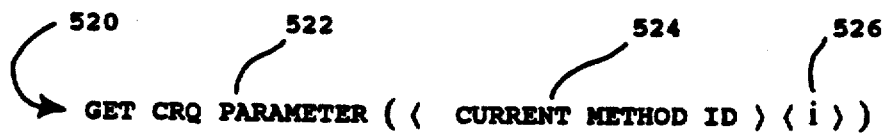
FIG. 23 is an illustration of a "Get GRQ" Parameter function call.

Referring now to FIG. 23, there is shown a function call 520 having a "GET CRQ Param" description 522 mapped onto interface service portion 224 and systems 204-208 and which causes the parameter identified within field 526, associated with a "CRQ" type message 250 to be returned. Field 524 defines the method generating function call 520.

It should now be apparent to one of ordinary skill in the art that by means of function calls 420, 440, 450, 460, 472, 484, 490, 498, 504, 510 and 520 one may create a simulation upon the Savoir/Flexis system 204-208 by means of the native programming language therein. The created simulation is then transformed or simultaneously mapped onto interface service portion 224 of the simulation tool of the preferred embodiment of this invention by means of the previously mapped descriptor portions 422, 442, 452, 462, 474, 486, 492, 500, 506, 512, and 522 and typical computerized pointing techniques.

(b). Siman System

An element in the Siman system 204-208, in the preferred embodiment of this invention, appears as a usual station block therein. Messages 250 received by the element appear as a usual element arriving at the station block at the time specified by the time stamp field 254 of said message 250. Parts modelled as entities are sent between Siman elements using the messaging of the preferred embodiment of this invention and use is not made of the usual route, transport, or convey services of the Siman system 204-208. Events 0-10 of the Siman system are reserved for the simulation tool of the preferred embodiment of this invention. Specifically, in operation, incoming "CRQ" command-type messages 250 will create a Siman element at TNOW equal to the contents of the time stamp field 254. Said message 250 is routed to the usual Siman element station block identified within field 252 of message 250. The normal Siman attributes of this element are as follows:

$A(1) = $ <usual Siman transaction number which must not be altered until after an "FRS" message is sent>

$A(2) = $ <identification of source element (i.e., field 266)>

$A(3) = $ <time stamp on message (i.e., field 254)>

$A(4) = $ <CRQ message code (i.e., field 256)>

$A(5) = $ <message parameter (i.e., field 258)>

When the method is complete, the element is then routed to the usual Siman EVENT:3 block. The attributes $A(1)$, $A(2)$ are not to be altered and the attribute $A(4)$ is ignored by EVENT:3. The attribute $A(3)$ is set to the time at which the "FRS" message type 250 should be received by the element which initiated the "CRQ" message 250 command. If $A(3) \leq TNOW$, then EVENT:3 will set the time stamp field 254 on the "FRS" message 250 equal to TNOW. Thusly this attribute does not need to be set unless a designer needs to delay the sending of an "FRS" type of message. Finally, attribute $A(5)$ is set to be the return parameter, if applicable.

The following Siman services are provided by the simulation tool made in accordance with the preferred embodiment of this invention:

○ Send CRQ
○ Wait For FRS
○ Send CMD
○ Receive CMD

Specifically, to send a "CRQ" type message 250, a designer creates a usual Siman element, assigns attributes, and directs the created element to the usual EVENT:2 Block. The following attributes are assigned:

$A(1) = $ Assigned automatically by the EVENT:2 Block itself and is used to match the "CRQ-FRS" messaging pairs. This attribute is not changed until the created element is released from the usual Siman queue.

$A(2) = $ Address of the destination element.

$A(3) = $ Time that the "CRQ" message should be acted upon by the destination element.

$A(4) = $ "CRQ" message code (i.e., specified method).

$A(5) = $ Message parameter.

The Siman block to be used in this message 250 creation is EVENT:2.

To create the "Wait For FRS" service the EVENT:2 Block which sent the "CRQ" command message should initially be followed by the typical Siman queue block and subsequently followed by a WAIT:A(1), 1 block. This usual QUEUE block will hold the element until the "FRS" message 250 is received. This reception will trigger the signal to release the element. This will happen when TNOW equals the time stamp field 254 on the "FRS" message 250. The element attributes associated with the "Wait For FRS" service are as follows:

A(1)=not used
A(2)=address of element sending "FRS" message type 250
A(3)=time stamp field 254 of message 250 which will be equal to TNOW when the element is released
A(4)=not used
A(5)=parameter field 258

The Siman block sequence is as follows:
Queue <Q#>
Wait & ACD, 1
<Q#>=the queue ID To send a "CMD" message 250 from a Siman element to another element, a designer creates the usual element and directs it to an EVENT:1 block. This block sends a message 250 and returns the element which is then either disposed of in the usual manner or used to send other messages.

The Siman attributes of the "Send CMD" service are as follows:
A(1)=not used
A(2)=address of the destination element
A(3)=time that the "CMD" message should be acted upon by the destination element
A(4)="CMD" message code (i.e., method)
A(5)32 message parameter The Siman block utilized within the "CMD" service is EVENT:1.

In order to create the "Receive CMD" service a usual Siman element is created upon the receipt of a typical message 250 and is scheduled to arrive at the element station block that corresponds to its destination address field 252 when TNOW=Time Stamp field 254.

The attributes of eh "Receive CMD" service are as follows:
A(1)=0 wherein 0 indicates that this is a "CMD" type of message
A(2)=address of the source element
A(3)=time stamp of the message
A(4)="CMD" message method
A(5)=message parameter The Siman block used in the creation of this service is:
STATION, <station id> wherein <station id>=the address of the destination element. In order to initialize the SIMAN system, one first step up an entity with A(1)=(no. queues and 1) (Note: no. queues is defined in the DISCRETE ELEMENT in the experimental file). Next, one send the entity to EVENT:0 at the beginning of the simulation.

(c). Robcad System

Referring now to the Robcad system 204–208, the preferred embodiment of this invention allows an element to be created from a typical Robcad task file which is associated with a physical device. Messages 250 received from an element are stored in typical arrays within the Robcad system 204–208. The simulation designer may access each piece or field 252–270 of message 250 through the usual Robcad index on said array. Parts are created and destroyed using the aforedescribed messaging of the preferred embodiment of this invention and the usual Robcad messaging is not used.

Specifically, according to the teachings of the preferred embodiment of this invention, a method is accomplished upon the receipt of a "CRQ" type of message 250. When the method is completed the usual "FRS" response is generated. The "CRQ" messsage 250 creates an array in the task identified by the destination field 252. This array contains the information contained within fields 252-270 of message 250. A demand method in Robcad is a routine written in the Robcad language which controls the actions of the device 218. Since a device 218 may perform only a single action at a time, only one demand method is activated at a time. Further, the information contained within the "CRQ" messages 250 determines when the action will begin as well as any parameters associated with the action, such as speed, distance and acceleration.

Figure 24:
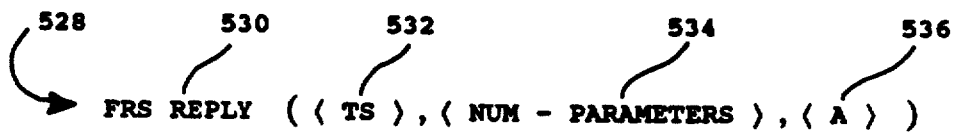

When the method is complete, the "FRS Reply" routine is used to return a "FRS" message 250 to the sending element. The function call 528 for an "FRS" reply message 250 is shown in FIG. 24 as having a descriptor 530 mapped onto the Robcad system 204–208 and service interface 224. Descriptor 530 allows said Robcad system 204–208 to generate a "FRS" reply type message 250 therefrom. Function call 528 further has field 532 representing time stamp field 254 of the created "FRS" reply message 250, field 534 defining the number of parameters to be placed within field 258 of message 250 and field 536 defining the actual parameters to be placed within field 258. An example of a typical Robcad demand method is:

Current Method = Select Method ( )
Select Code (Current Method) of
Case:
 ROBOTOVERPISTON
 move pwait;
 FRS Reply (Curr - time, 1, A);
Case:
 ROBOTGETPART
 move ptake;
 $range = 700;
 take iworkp;
 move pwait;
 FRS Reply (Curr - time, O, A);
 End Select Services in Robcad are performed using a plurality of function calls which are used by the designer in the native programming language thereof. Additional supported function calls are as follows:
○ send CMD
○ wait for FRS
○ wait for CMD To send a "CRQ" type message 250 a designer creates an array for the parameters within the message 250 and uses the function call "Send CRQ" which is mapped onto interface portion 224 and systems 204–208 such that a "Send CRQ" message 250 may be generated within the system 200 of this invention. The message 250 is internally queued so that when the "FRS" message 250 is returned the service can match the "FRS" to the "CRQ" message 250 in the manner stated earlier.

Figure 25:
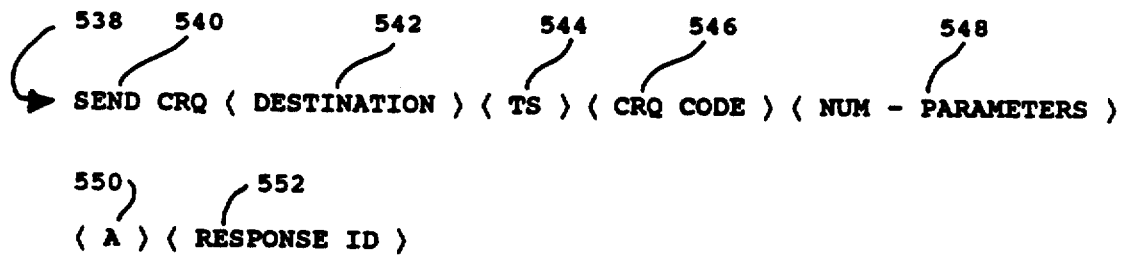

Referring now to FIG. 25 there is shown a "Send CRQ" function call 538 having a "Send CRQ" descriptor 540 mapped, in the usual manner, to interface 224 and systems 204–208. Function call 538 also has fields 542 specifying the destination element's address, 544 specifying the time that the function should be done at, 546 defining the "CRQ" method, 548 defining the number of parameters to be sent to the destination element, 550 representing an array containing the actual parameters, and 552 defining an integer, (selected by the designer) as a way to check whether the corresponding FRS message 250 has arrived.

Figure 26:
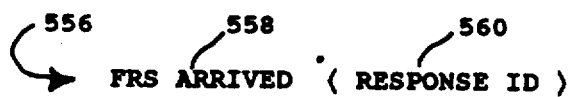

The designer uses the "FRS Arrived" macro or function call command to see whether the "FRS" message 250 has arrived. The "FRS Arrived" macro returns a boolean value. Referring to FIG. 26, there is shown a "FRS Arrived" function call 556 containing a descriptor 558 mapped to interface 224 and systems 204–208 in the usual manner and having field 560 selected by the designer to give a logical high boolean value upon receipt of the FRS message type 250.

Figure 27:
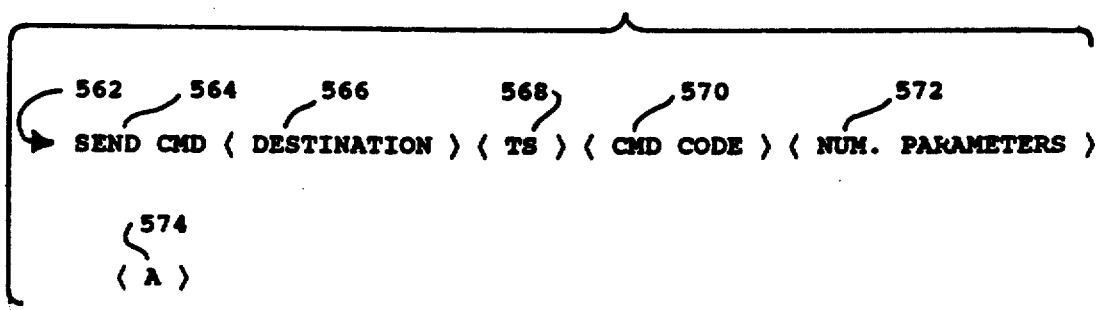

The "Send CMD" function call 562, shown in FIG. 27, is used to send a "CMD" type of message 250 to another element and contains a descriptor 564 mapped in the usual manner to interface portion 224 and systems 204–208. Function call 562 has field 566 specifying the address of the destination element, field 568 specifying the time that the generated "CMD" message 250 is to be acted upon, field 570 specifying the method to be put in message 250, field 572 specifying the number of parameters within message 250 and field 574 defining the actual parameters used within message 250.

Figure 28:

Function call 576, shown in FIG. 28, has a descriptor 578 mapped in the usual manner to interface 224 and systems 204–208, and is used to determine whether a "CMD" type of message 250 having a field 256 substantially equal to the value of field 580 has arrived. After a "CMD" message 250 has arrived, a boolean of logical true is issued.

Figure 29:
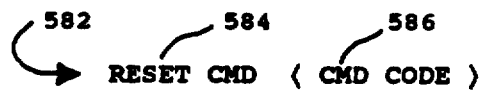

Function call 582, shown in FIG. 29, is used to reset the boolean created by the arrival of a typical "CMD" type message 250 having a field 256 equal to field 586 and contains a descriptor 584 mapped in the usual manner to interface portion 224 and systems 204–208.

Figure 30:

Function call 588, shown in FIG. 30, is used to get parameters of the "FRS" message 250 that was returned from another element. Function call 588 is seen to contain a descriptor 590 mapped in the usual manner to interface portion 224 and system 204–208, field 592 which is made to be the same as field 552 of the "CRQ" message 250 that was previously sent, and field 594 defining which parameter is to be obtained.

Function call 596, shown in FIG. 31, is used to get the parameters, specified by field 602, of a "CMD" message 250 having a field 256 substantially equal to the value of field 600, after said "CMD" message 250 has arrived. Function call 596 has descriptor 598 mapped in the usual manner to interface 224 and systems 204–208.

Function call 604, shown in FIG. 32, is used to get the parameters of a "CRQ" type message 250 when the method called thereby has been started. Function call 604 has a descriptor 606 mapped in the usual manner to interface portion 224 and systems 204–208, and field 608 defining the parameter to be obtained.

Function call 610, shown in FIG. 33, is used to determine the method code of an incoming message 250 and returns an integer defining the method code. Function call 610 contains a descriptor portion 612 mapped in the usual manner to interface portion 224 and systems 204–208, and field 614 identifying the next "CRQ" message to be processed. Additionally, the system of the preferred embodiment of this invention provides the Robcad system 204–208 with a function call (not shown) which is used to determine if there are any "CRQ" messages left to be processed. Thusly, both the Siman and the Robcad systems 204–208, as was the case for the Flexis system, are allowed to be programmed in their own native programming languages. The system of the preferred embodiment of this invention maps this native programming language onto a unique simulation system 204–208 through service interface 224 and allows these dissimilar simulation systems 204–208 to interactively communicate thereby providing a single system simulation.

v. Epilogue

It should be apparent to one of ordinary skill in the art that the simulation tool of this invention allows a plurality of dissimilar simulation systems 204–208 to be interactively networked in a cooperate manner so as to provide a single overall system simulation. Additionally library portion 216 may be used to store developed simulation code for later use and thusly, along with the partitioning methodology developed earlier, allows for a substantially large savings in resources and simulation development time.

It is to be understood that the invention is not limited to the exact construction or method illustrated and described above, but that various changes and modifications may be made without departing from the spirit and scope of the invention as defined in the following claims.

We claim:

1. A simulation system which permits a plurality of dissimilar simulation systems to be interactively coordinated to create a single integrated simulation of an automation system, said dissimilar simulation systems being originally software incompatible with each other and comprising a first and second dissimilar simulation systems, said first dissimilar simulation system defining events at different time intervals from said second dissimilar simulation system, said simulation system comprising:

a discrete event simulation system defining a plurality of discrete event simulation elements which define events at irregular points in time therein, said discrete event simulation elements generating a plurality of messages therefrom;

a kinematic simulation system defining a plurality of kinematic simulation elements therein which define events at regular points in time, said kinematic simulation elements generating a plurality of messages therefrom;

a control simulation system defining a plurality of control simulation elements therein, each of said control simulation elements generating a plurality of messages therefrom and being uniquely associated with and in communication with one of said plurality of discrete event and kinematic simulation elements;

each of said discrete event, said kinematic, and said control simulation systems being one of said plurality of dissimilar simulation systems;

communication means, connected to each of said dissimilar simulation systems, for routing messages among said dissimilar simulation systems;

library means, connected to said communication means for creating and storing said discrete event simulation elements, said kinematic simulation elements, and said control simulation elements therein; and synchronization means for synchronizing the delivery of information to and from said dissimilar simulation systems, said synchronization means being connected to said communication means and being operable to provide a time stamp upon each message of said pluralities of messages and for enabling said discrete event, kinematic, and control simulation systems to cooperate in creating said single integrated simulation, said synchronization means including:

a centralized synchronization manager, and a plurality of local synchronization managers, each of said local synchronization managers being connected to a simulation system being interactively coordinated to create said single integrated simulation of an automation system.

2. The simulation system of claim 1 further comprising means, connected to said synchronization means, for creating and storing a unique system address associated with each simulation therein.

3. The simulation system of claim 1 wherein said plurality of dissimilar simulation systems each has a unique programming language associated therewith, said simulation system further comprising interface means, connected to each of said dissimilar simulation systems, for allowing each of said systems to send said messages associated therewith to said communication means and for allowing said associated messages to be created by use of said unique programming language therein.

4. The simulation system of claim 1, further including network means, connected to said discrete event, kinematic and control simulation systems, for transporting messages therebetween.

5. The simulation system of claim 4 wherein said network means comprises a twisted wire.

6. The simulation system of claim 4 wherein said network means comprises a coaxial cable.

7. The simulation system of claim 1, wherein said communication means comprises:

a centralized communications manager; and a plurality of local communications managers, each of said local communications managers being connected to a unique simulation system and being in communication with said centralized communications manager.

8. The simulation tool of claim 1 wherein said routed messages comprises:

a first field specifying a destination element address;

a second field specifying a time stamp;

a third field specifying a method to be performed;

a fourth field specifying a parameter associated with said method;

a fifth field specifying a source element address;

a sixth field specifying a synchronization identification;

a seventh field specifying a synchronization time; and an eighth field specifying an error correcting code.

* * * * *